(12) United States Patent
Lee et al.

(10) Patent No.: US 12,739,319 B2
(45) Date of Patent: Sep. 15, 2026

(54) ELECTRONIC DEVICE INCLUDING PLURALITY OF SUPPORT STRUCTURES FOR SUPPORTING FLEXIBLE DISPLAY

(71) Applicant: SAMSUNG ELECTRONICS CO., LTD., Suwon-si (KR)

(72) Inventors: Jinju Lee, Suwon-si (KR); Hwamok Pak, Suwon-si (KR); Jongkeun Kim, Suwon-si (KR); Jinwook Baik, Suwon-si (KR); Minyee An, Suwon-si (KR); Dongik Lee, Suwon-si (KR); Sunggun Cho, Suwon-si (KR); Wonhee Choi, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 238 days.

(21) Appl. No.: 18/761,703

(22) Filed: Jul. 2, 2024

(65) Prior Publication Data

US 2024/0357028 A1 Oct. 24, 2024

Related U.S. Application Data

(63) Continuation of application No. PCT/KR2022/020709, filed on Dec. 19, 2022.

(30) Foreign Application Priority Data

Feb. 11, 2022 (KR) ........................ 10-2022-0017972
Feb. 24, 2022 (KR) ........................ 10-2022-0024227

(51) Int. Cl.
*G06F 1/16* (2006.01)
*G09F 9/30* (2006.01)
(Continued)

(52) U.S. Cl.
CPC ....... *H04M 1/0269* (2022.02); *H04M 1/0237* (2013.01); *H04M 1/0249* (2013.01); *H05K 5/0018* (2022.08); *H05K 5/0217* (2013.01)

(58) Field of Classification Search
None
See application file for complete search history.

(56) References Cited

U.S. PATENT DOCUMENTS 6,208,874 B1 * 3/2001 Rudisill .............. H04M 1/0237 455/575.4
11,012,546 B1 5/2021 Song et al.
(Continued)

FOREIGN PATENT DOCUMENTS

CN 109358708 A * 2/2019 ........... G06F 1/1669
CN 109378659 A * 2/2019 ............. H01R 27/00
(Continued)

OTHER PUBLICATIONS

Extended European Search Report corresponding to Application No. 22926221.7-1218; Dated Jan. 16, 2025.

*Primary Examiner* — Mohammed Rachedine
(74) *Attorney, Agent, or Firm* — CANTOR COLBURN LLP

(57) ABSTRACT

An electronic device includes a first housing; a second housing that can be drawn into and out of the first housing; a guide rail connected; and a display module supported by at least one of the first housing or the second housing and having a display region that varies according to the movement of the second housing relative to the first housing. The display module includes a display panel, a support plate positioned on the rear surface of the display panel, and support structures positioned on the rear surface of the support plate. The support structures include a support bar and a guide head positioned at one end of the support bar. The guide head includes a guide portion, which can slide
(Continued)

along the guide rail, and an extension portion, which extends from the guide portion and is positioned between one end of the support bar and the support plate.

20 Claims, 25 Drawing Sheets

(51) Int. Cl.

| | |
|---|---|
| ***H04M 1/02*** | (2006.01) |
| ***H05K 5/00*** | (2006.01) |
| ***H05K 5/02*** | (2006.01) |

(56) References Cited

U.S. PATENT DOCUMENTS

| | | | | |
|---|---|---|---|---|
| 11,058,018 | B1 | 7/2021 | Yoon et al. | |
| 2006/0099837 | A1* | 5/2006 | Cheng | H05K 5/10 439/131 |
| 2008/0194120 | A1* | 8/2008 | Vatanparast | H04M 1/0237 439/32 |
| 2009/0036179 | A1* | 2/2009 | Chiou | H04M 1/0237 455/575.4 |
| 2010/0014236 | A1* | 1/2010 | Zou | H04M 1/0237 74/96 |
| 2010/0285853 | A1* | 11/2010 | Endo | G06F 1/1624 455/575.4 |
| 2010/0302716 | A1* | 12/2010 | Gandhi | G06F 1/1624 455/575.8 |
| 2011/0176261 | A1* | 7/2011 | Wu | H04M 1/0237 361/679.01 |
| 2020/0120814 | A1 | 4/2020 | Huang | |
| 2022/0210930 | A1* | 6/2022 | Wen | G06F 1/1626 |

FOREIGN PATENT DOCUMENTS

| | | | | |
|---|---|---|---|---|
| EP | 4391500 | A1 * | 6/2024 | G06F 3/041 |
| KR | 20170026021 | A | 3/2017 | |
| KR | 101792692 | B1 | 11/2017 | |
| KR | 20190101605 | A | 9/2019 | |
| KR | 200491560 | Y1 * | 4/2020 | G01V 8/14 |
| KR | 20200108754 | A | 9/2020 | |
| KR | 102269604 | B1 | 6/2021 | |
| KR | 102274481 | B1 | 7/2021 | |
| KR | 20210082742 | A | 7/2021 | |
| KR | 102322916 | B1 | 11/2021 | |
| WO | 2021246561 | A1 | 12/2021 | |
| WO | 2022014908 | A1 | 1/2022 | |

* cited by examiner

ELECTRONIC DEVICE INCLUDING PLURALITY OF SUPPORT STRUCTURES FOR SUPPORTING FLEXIBLE DISPLAY

CROSS-REFERENCE TO RELATED APPLICATIONS

This application is a continuation application of International Application No. PCT/KR2022/020709 designating the United States, filed on Dec. 19, 2022, in the Korean Intellectual Property Receiving Office and claiming priority to Korean Patent Application No. 10-2022-0017972, filed on Feb. 11, 2022, and Korean Patent Application No. 10-2022-0024227, filed on Feb. 24, 2022, in the Korean Intellectual Property Office, the disclosures of which are incorporated by reference herein in their entireties.

TECHNICAL FIELD

Various embodiments of the present disclosure relate to an electronic device including a plurality of support structures for supporting a flexible display.

BACKGROUND ART

Electronic devices are gradually becoming slimmer and are being developed in various ways to strengthen design aspects and differentiate functional elements at the same time. Electronic devices are being transformed from a uniform rectangular shape into a variety of shapes. An electronic device having a transformable structure has been developed so that the user may easily carry the electronic device while using a wide screen display.

DISCLOSURE OF THE INVENTION

Technical Solutions

In a rollable electronic device, a screen display area of a display may be extended as one of housings moves relative to the other housing. In case of the rollable electronic device, a flexible display may also slide along a guide rail according to the movement of the housing. To guide a sliding path of the flexible display, a plurality of support structures may be disposed to each other and may be attached to the rear surface of the display panel. The support structure may include a support bar for supporting the display panel and a guide head connected to an end of the support bar to slide along the guide rail. Conventionally, the support bar and the guide head are connected to each other by welding, but when a defect occurs in welding, the alignment of the support bar and the guide head may be misaligned or the heights thereof may be different. In addition, the guide head may be separated from the support bar due to a repulsive force of the display.

According to various embodiments of the present disclosure, a support bar and a guide head may be connected to each other and may be attached to a support plate.

According to various embodiments, separation of a guide head from a support bar due to a repulsive force of a display may be reduced.

Technical goals of the present disclosure are not limited to what is described in the foregoing, and other technical goals that are not described above may also be clearly understood by those skilled in the art from the following description.

In an embodiment, an electronic device 300 may include a first housing 310, a second housing 320 connected to the first housing to enable insertion or withdrawal of the second housing 320 into or from the first housing 310, a guide rail 321 connected to the second housing 320, a display module 330 which is supported by at least one of the first housing 310 and the second housing 320 and of which a display area changes depending on a movement of the second housing 320 relative to the first housing 310, wherein the display module may include a display panel 331, a support plate 332 disposed on a rear surface of the display panel 331, and a plurality of support structures 400 spaced apart from each other and disposed on a rear surface of the support plate 332, wherein each of the support structures 400 may include a support bar 410 formed in a longitudinal direction and a guide head 420 disposed on an end of the support bar 410, wherein the guide head 420 may include a guide portion 421 that is slidable along the guide rail 321, and an extension 422 extending from an end of the guide portion 421, wherein at least a portion of the extension 422 is disposed between the end of the support bar 410 and the support plate 332.

In an embodiment, the electronic device 300 may include the first housing 310, the second housing 320 connected to the first housing to enable insertion or withdrawal of the second housing 320 into or from the first housing 310, an intermediate guide rail 323 connected to the second housing 320, and the display module 330 which is supported by at least one of the first housing 310 and the second housing 320 and of which a display area changes depending on a movement of the second housing 320 relative to the first housing 310, wherein the display module 330 may include the display panel 331, the support plate 332 disposed on the rear surface of the display panel 331, and the plurality of support structures 400 spaced part from each other and disposed on the rear surface of the support plate 332, wherein the support structure 400 may include a first support bar **410*a* formed in a longitudinal direction, a second support bar 410*b* formed in the same longitudinal direction as the first support bar 410*a*, and an intermediate guide head 430 disposed between the first support bar 410*a* and the second support bar 410*b*, wherein the intermediate guide head 430 may include an intermediate guide portion 431 that is slidable along the intermediate guide rail 323, a first extension 432*a* which extends from an end of the intermediate guide portion 431 and of which at least a portion is disposed between an end of the first support bar 410*a* and the support plate 332, and a second extension 432*b* which extends from the other end of the intermediate guide portion 431 and of which at least a portion is disposed between an end of the second support bar 410*b* and the support plate 332**.

In an embodiment, the electronic device 300 may include the first housing 310, the second housing 320 connected to the first housing to enable insertion or withdrawal of the second housing 320 into or from the first housing 310, the guide rail 321 connected to the second housing 320, and the display module 330 which is supported by at least one of the first housing 310 and the second housing 320 and of which a display area changes depending on a movement of the second housing 320 relative to the first housing 310, wherein the display module 330 may include the display panel 331, the support plate 332 disposed on the rear surface of the display panel 331, the plurality of support structures 400 spaced apart from each other and disposed on the rear surface of the support plate 332, and the support structure 400 may include the support bar 410 formed in the longitudinal direction and the guide head 420 disposed on an end of the support bar 410, wherein the guide head 420 may include the guide portion 421 that is slidable along the guide rail 321, the extension 422 which extends from an end of the guide portion 421 and of which at least a portion is disposed between the end of the support bar 410 and the support plate 332, a protrusion 423 protruding from the rear surface of the extension 422, and a pair of side walls 424 extending from both side ends of the extension 422 in the rear direction to form a seating space 425, wherein the support bar 410 may include a bar portion 411 having a longitudinal direction, a connecting part 412 extending from an end of the bar portion 411 and seated on the seating space 425, and a recessed groove 413 from a front surface of the connecting part 412 to insert the protrusion 423 therein.

Effects of the Invention

According to various embodiments, a yield and surface quality of a display may be improved by connecting a support bar and a guide head to each other and attaching the support bar and the guide head to a support plate.

According to various embodiments, separation of a guide head from a support bar due to a repulsive force of a display may be reduced and furthermore, damage of the display may be reduced.

The effects of the electronic device according to various embodiments are not limited to the above-mentioned effects, and other unmentioned effects can be clearly understood from the following description by one of ordinary skill in the art.

BRIEF DESCRIPTION OF DRAWINGS

FIG. 4O is a perspective view of a support bar and a guide head according to an embodiment.

BEST MODE FOR CARRYING OUT THE INVENTION

Figure 1:
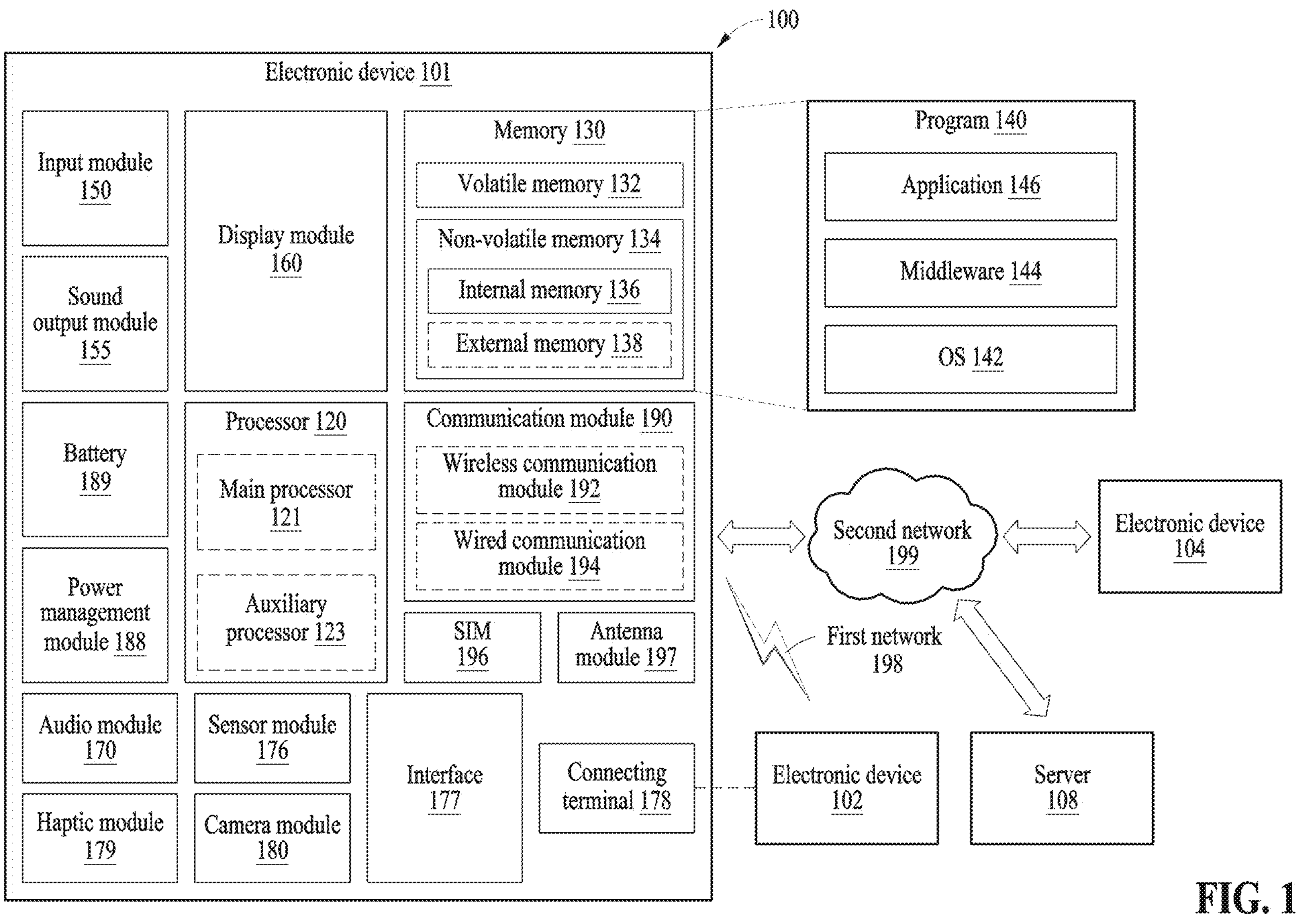
FIG. 1 is a block diagram illustrating an electronic device 101 in a network environment 100 according to an embodiment.

Hereinafter, embodiments will be described in detail with reference to the accompanying drawings. When describing the embodiments with reference to the accompanying drawings, like reference numerals refer to like components, and any repeated description related thereto will be omitted.

FIG. 1 is a block diagram illustrating an electronic device 101 in a network environment 100 according to an embodiment. Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to one embodiment, the electronic device 101 may communicate with the electronic device 104 via the server 108. According to one embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the above components may be omitted from the electronic device 101, or one or more other components may be added in the electronic device 101. In some embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to one embodiment, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to one embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to one embodiment, the auxiliary processor 123 (e.g., an ISP or a CP) may be implemented as a portion of another component (e.g., the camera module 180 or the communication module 190) that is functionally related to the auxiliary processor 123. According to one embodiment, the auxiliary processor 123 (e.g., an NPU) may include a hardware structure specified for artificial intelligence (AI) model processing. An AI model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130 and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to one embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to one embodiment, the display module 160 may include a touch sensor adapted to sense a touch, or a pressure sensor adapted to measure an intensity of a force incurred by the touch.

The audio module 170 may convert a sound into an electrical signal or vice versa. According to one embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to one embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., by wire) or wirelessly. According to an embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation. According to one embodiment, the haptic module 179 may include, for example, a motor, a piezoelectric element, or an electric stimulator.

The camera module 180 may capture a still image and moving images. According to an embodiment, the camera module 180 may include one or more lenses, image sensors, ISPs, or flashes.

The power management module 188 may manage power supplied to the electronic device 101. According to an embodiment, the power management module 188 may be implemented as, for example, at least a part of a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to one embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to one embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to one embodiment, another component (e.g., a radio frequency integrated circuit (RFIC)) other than the radiating element may be additionally formed as a part of the antenna module 197.

According to one embodiment, the antenna module 197 may form a mmWave antenna module. According to an embodiment, the mm Wave antenna module may include a PCB, an RFIC disposed on a first surface (e.g., a bottom surface) of the PCB or adjacent to the first surface and capable of supporting a designated a high-frequency band (e.g., the mm Wave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 and 104 may be a device of the same type as or a different type from the electronic device 101. According to one embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the result, with or without further processing the result, as at least part of a response to the request. To this end, cloud computing, distributed computing, mobile edge computing (MEC), or client-server computing technology may be used, for example. The electronic device 101 may provide ultra low-latency services using, e.g., distributed computing or mobile edge computing. In one embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., a smart home, a smart city, a smart car, or healthcare) based on 5G communication technology or IoT-related technology.

The electronic device according to embodiments may be one of various types of electronic devices. The electronic device may include, for example, a portable communication device (e.g., a smartphone), a computer device, a portable multimedia device, a portable medical device, a camera, a wearable device, or a home appliance device. According to an embodiment of the present disclosure, the electronic device is not limited to those described above.

It should be appreciated that various example embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., by wire), wirelessly, or via a third element.

As used in connection with embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to one embodiment, the module may be implemented in a form of an application-specific integrated circuit (ASIC).

Embodiments as set forth herein may be implemented as software (e.g., the program 140) including one or more of instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments disclosed herein may be included and provided in a computer program product. The computer program product may be traded as a product between a seller and a buyer. The computer program product may be distributed in the form of a machine-readable storage medium (e.g., compact disc read-only memory (CD-ROM)), or be distributed (e.g., downloaded or uploaded) online via an application store (e.g., PlayStore™), or between two user devices (e.g., smartphones) directly. If distributed online, at least portion of the computer program product may be temporarily generated or at least temporarily stored in the machine-readable storage medium, such as memory of the manufacturer's server, a server of the application store, or a relay server.

According to embodiments, each component (e.g., a module or a program) of the above-described components may include a single entity or multiple entities, and some of the multiple entities may be separately disposed in different components. According to embodiments, one or more of the above-described components may be omitted, or one or more other components may be added. Alternatively or additionally, a plurality of components (e.g., modules or programs) may be integrated into a single component. In such a case, according to embodiments, the integrated component may still perform one or more functions of each of the plurality of components in the same or similar manner as they are performed by a corresponding one of the plurality of components before the integration. According to embodiments, operations performed by the module, the program, or another component may be carried out sequentially, in parallel, repeatedly, or heuristically, or one or more of the operations may be executed in a different order or omitted, or one or more other operations may be added.

Figure 2A:
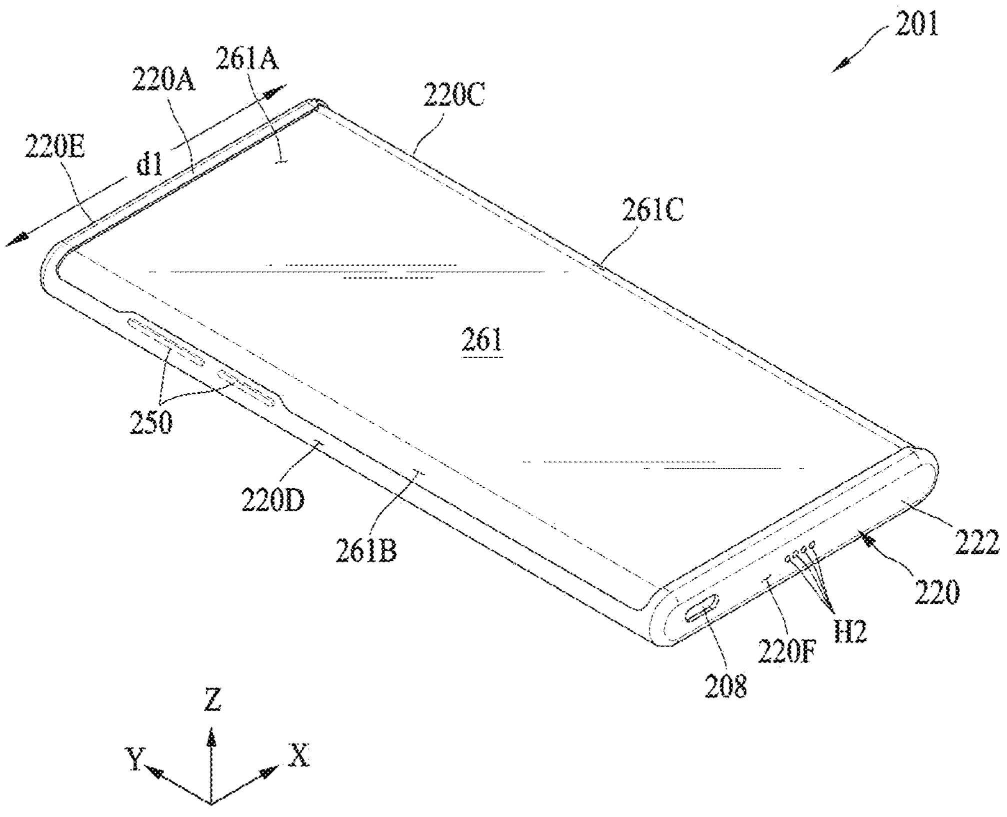
FIGS. 2A and 2B are front perspective views respectively illustrating a first state and a second state of an electronic device 201 according to various embodiments.
Figure 2B:
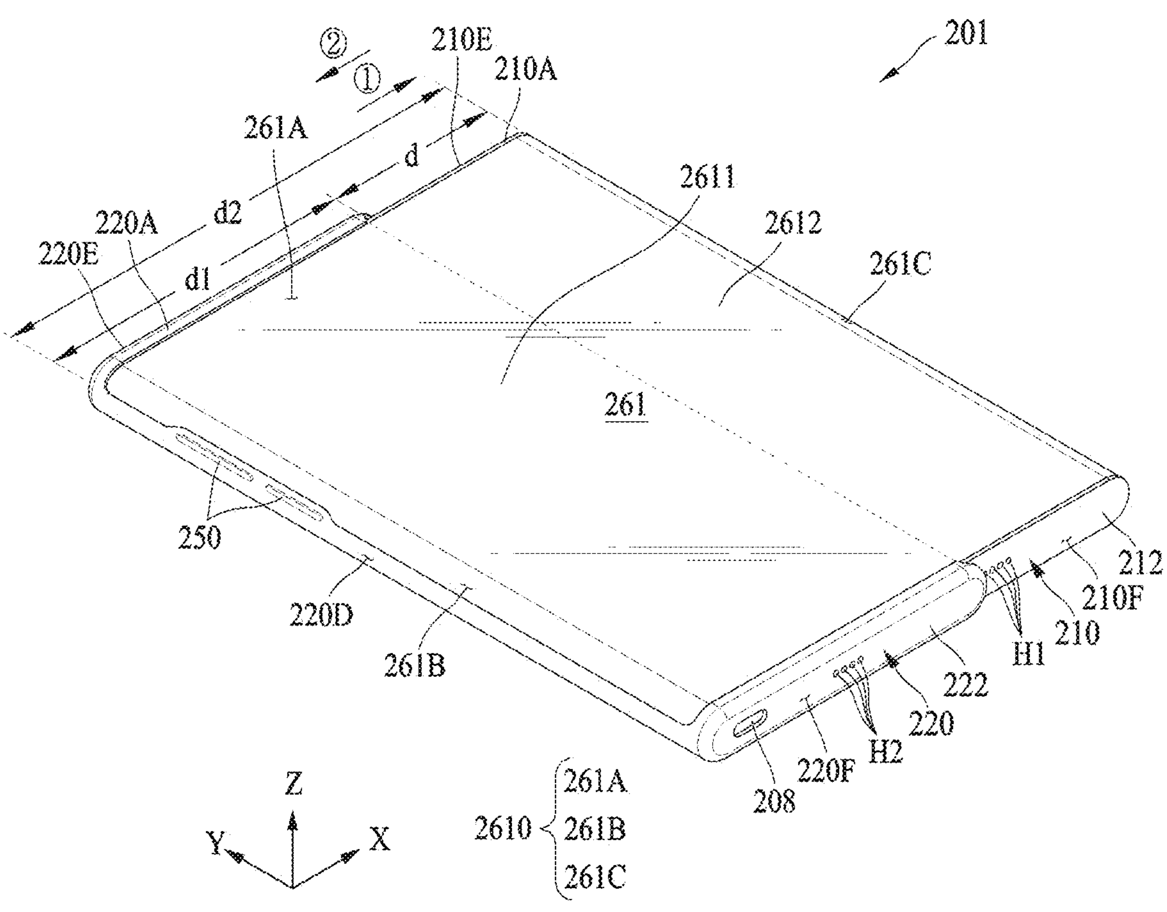
Figure 2C:
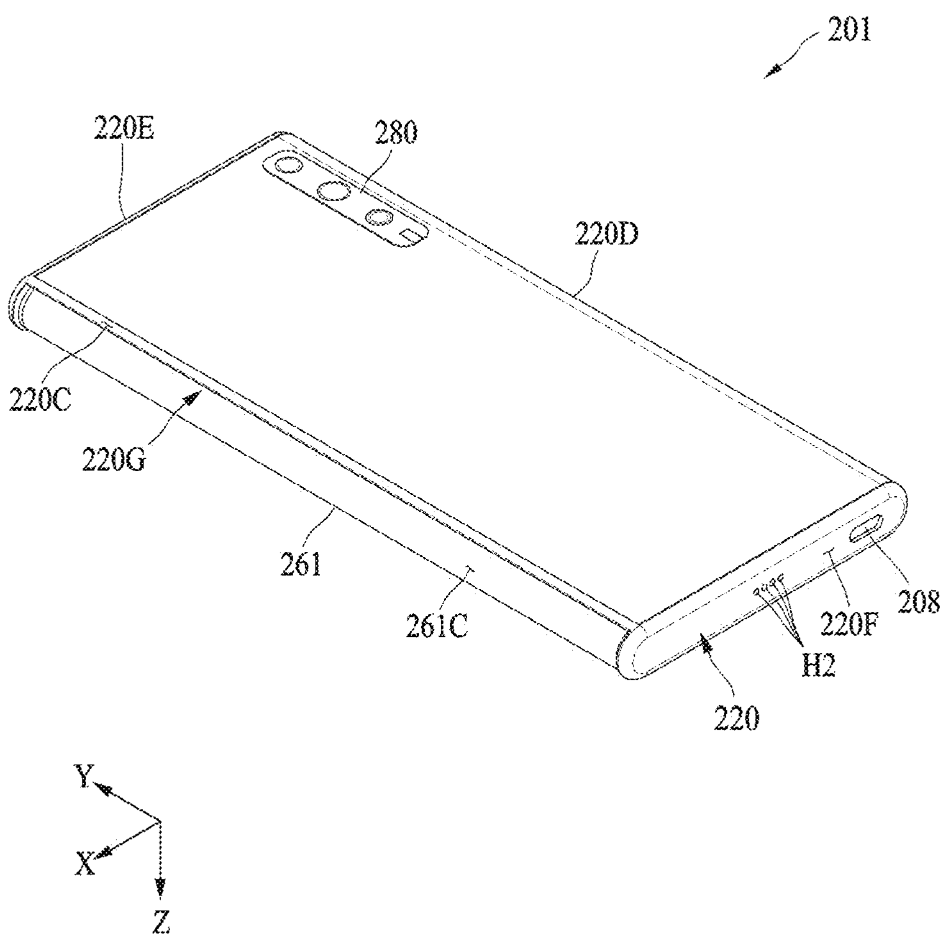
FIGS. 2C and 2D are rear perspective views respectively illustrating the first state and the second state of the electronic device 201 according to various embodiments.
Figure 2D:
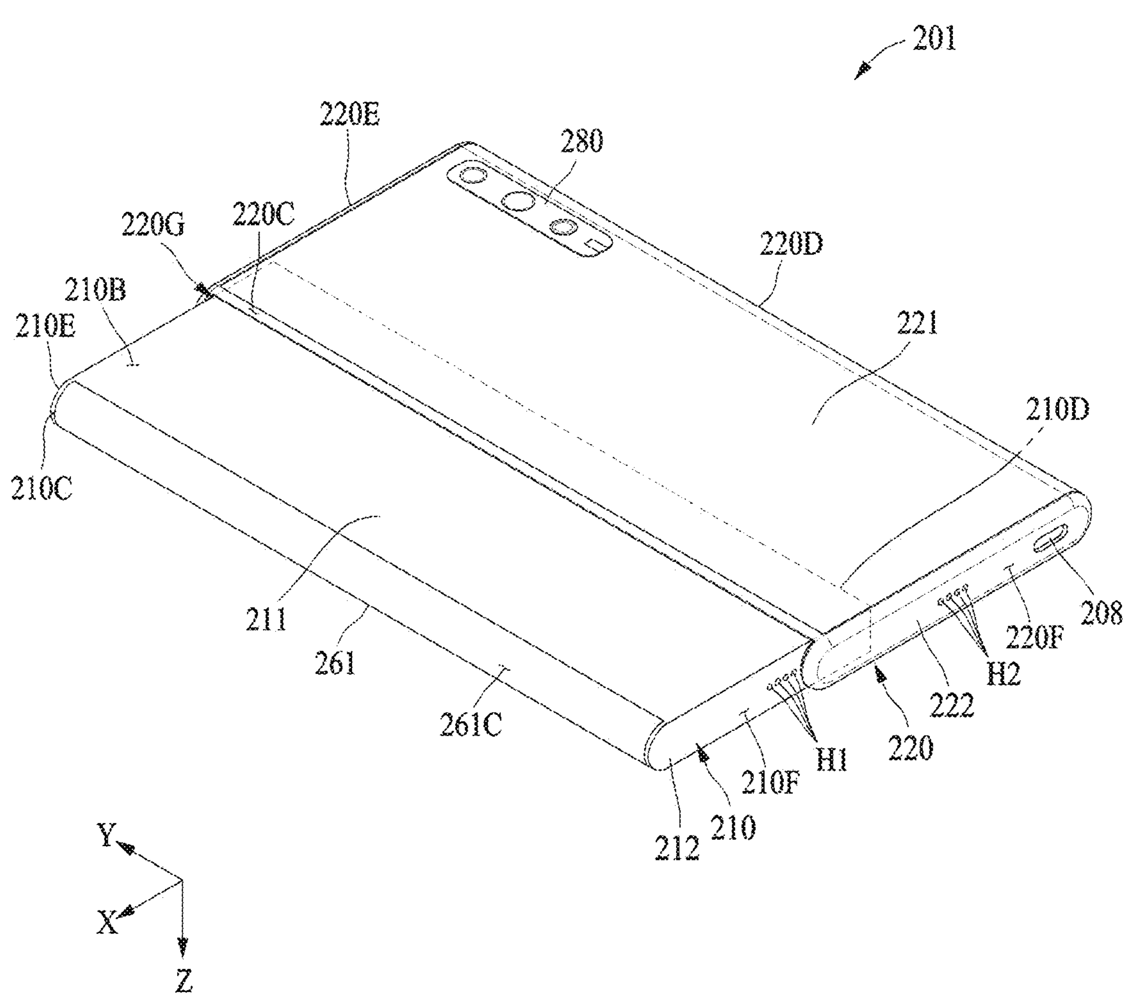

FIGS. 2A and 2B are front perspective views respectively illustrating a first state and a second state of an electronic device 201 according to various embodiments, and FIGS. 2C and 2D are rear perspective views respectively illustrating the first state and the second state of the electronic device 201 according to various embodiments.

Referring to FIGS. 2A to 2D, the electronic device 201 in various embodiments may include housings 210 and 220 forming an external figure and accommodating components therein. In an embodiment, the housings 210 and 220 may include the first housing 220 and the second housing 210 that are movably coupled to each other. In an embodiment, the second housing 210 may be slidably connected to the first housing 220. For example, the second housing 210 may move relative to the second housing 220 in a first moving direction (direction ① (e.g., a +X direction) or may be movably connected to the first housing 220 in a second moving direction (direction ② (e.g., a −X direction) that is opposite to the first moving direction (direction ①. Hereinafter, various embodiments provided herein describe that the second housing 210 moves relative to the first housing 220, but this is for the description of the relative movement between the second housing 210 and the first housing 220. Therefore, it may be construed that the first housing 220 moves relative to the second housing 210.

In an embodiment, according to the movement of the second housing 210 relative to the first housing 220, a state of the electronic device 201 may be changed between a first state and a second state. In an embodiment, the electronic device 201 may have a contracted shape in the first state (see FIG. 2A) and an extended shape in the second state (see FIG. 2B). The electronic device 201 may be used in the first state or the second state or may be used in an intermediate state between the first state and the second state.

In an embodiment, the second housing 210 may include a first surface 210A (e.g., a first front surface), a second surface 210B (e.g., a first rear surface) opposite to the first surface 210A, a first side surface 210C facing a first lateral direction (e.g., a +X direction) and disposed between the first surface 210A and the second surface 210B, a second side surface 210D facing a second lateral direction (e.g., a −X direction) opposite to the first lateral direction and disposed between the first surface 210A and the second surface 210B, a third side surface 210E facing a third lateral direction (e.g., a +Y direction) crossing the first lateral direction and disposed between the first surface 210A and the second surface 210B, and a fourth side surface 210F facing a fourth lateral direction (e.g., a −Y direction) opposite to the third lateral direction and disposed between the first surface 210A and the second surface 210B. In an embodiment, the second housing 210 may include a first plate 211, and a first side frame 212 that substantially extends in a thickness direction (e.g., a Z-axis direction) along an edge of the first plate 211. In an embodiment, the first plate 211 may form the second surface 210B, and the first side frame 212 may form the first side surface 210C, the second side surface 210D, the third side surface 210E, and the fourth side surface 210F. In an embodiment, the first plate 211 and the first side frame 212 may be integrally formed, or may be separately formed to be coupled to each other.

In an embodiment, the first housing 220 may include a third surface 220A (e.g., a second front surface), a fourth surface 220B (e.g., a second rear surface) opposite to the third surface 220A, a fifth side surface 220C facing the first lateral direction (e.g., the +X direction) and disposed between the third surface 220A and the fourth surface 220B, a sixth side surface 220D facing the second lateral direction (e.g., the −X direction) opposite to the first lateral direction and disposed between the third surface 220A and the fourth surface 220B, a seventh side surface 220E facing the third lateral direction (e.g., the +Y direction) crossing the first lateral direction and disposed between the third surface 220A and the fourth surface 220B, and an eighth side surface 220F facing the fourth lateral direction (e.g., the −Y direction) opposite to the third lateral direction and disposed between the third surface 220A and the fourth surface 220B. In an embodiment, the first housing 220 may include a second plate 221 and a second side frame 222 that substantially extends in a thickness direction (e.g., a Z-axis direction) along an edge of the second plate 221. In an embodiment, the second plate 221 may form the fourth surface 220B, and the second side frame 222 may form the fifth side surface 220C, the sixth side surface 220D, the seventh side surface 220E, and the eighth side surface 220F. In an embodiment, the second plate 221 and the second side frame 222 may be integrally formed or may be separately formed to be coupled to each other.

In an embodiment, the second housing 210 and the first housing 220 may form a front surface (e.g., a surface facing a +Z direction) of the electronic device 201 through the first surface 210A and the third surface 220A and may form a rear surface (a surface facing a −Z direction) of the electronic device 201 through the second surface 210B and the fourth surface 220B. In an embodiment, the first housing 220 may include an open portion 220G (see FIGS. 2C and 2D) in which at least a portion of the fifth side surface 220C is open to insert the second housing 210 partially and movably therein. However, this is an example, and in another embodiment, the second housing 210 may include an open portion in which at least a portion of the second side surface 210D is open and the first housing 220 may be partially and movably inserted into the second housing 210 through the open portion formed in the second side surface 210D.

In an embodiment, the electronic device 201 may include a display 261 (e.g., a flexible display or a rollable display) configured to display visual information. In an embodiment, the display 261 may be visually exposed to the outside of the electronic device 201 through a display area 2610. In an embodiment, the display area 2610 may include a first area 261A disposed on the first surface 210A and the third surface 220A, a second area 261B disposed on the sixth side surface 220D, and a third area 261C disposed on the first side surface 210C and at least partially enclosing an open portion 261G. In an embodiment, the second area 261B and the third area 261C may form a flexibly curved surface. In an embodiment, the second area 261B may be at least partially positioned on the first surface 210A and the third surface 220A. In an embodiment, the third area 261C may be at least partially positioned on the first surface 210A and the third surface 220A or may be at least partially positioned on the second surface 210B and the fourth surface 220B. In an embodiment, the display 261 may display a screen on the display area 2610. The display 261 may display one connected screen through the whole display area 2610 and may display a screen through a portion of the display area 2610. In another embodiment, the display 261 may display a plurality of screens partially divided through the display area 2610. For example, the display 261 may display one screen through the first area 261A and may display another screen, which is different from the screen displayed through the first area 261A, through the second area 261B and/or the third area 261C.

In an embodiment, the display 261 may include a flat portion 2611, which forms at least a portion (e.g., the first area in the first state) of the display area 2610 and is supported by the first housing 220, and a rolling portion 2612 (or a bending portion) extending from the flat portion 2611. The rolling portion 2612 may be withdrawn from the inside to the outside of the electronic device 201 or may be inserted into the inside from the outside of the electronic device 201 according to the movement of the second housing 210 relative to the first housing 220. The rolling portion 2612 withdrawn to the outside of the electronic device 201 may be disposed on the first surface 210A and may be exposed to the outside of the electronic device 201 and may form the display area 261A, 261B, or 261C with the flat portion 2611. The size of the display area 261A, 261B, or 261C may change depending on the degree of withdrawal of the rolling portion 2612.

In an embodiment, the size of the display area 2610 (e.g., the first area 261A, the second area 261B, and the third area 261C) of the display 261 may change as a state of the electronic device 201 changes. In an embodiment, the display area 2610 of the display 261 may form a first area (e.g., a minimum area) reduced to the minimum in the first state (e.g., a reduced state or the shape of FIG. 2A) of the electronic device 201 and may form a second area (e.g., a maximum area) extended to the maximum in the second state (e.g., an extended state or the shape of FIG. 2C) of the electronic device 201. When the electronic device 201 is between the first state and the second state, the display 261 may expand or reduce the size of the display area 2610, corresponding to the state of the electronic device 201. For example, while changing from the first state to the second state, when the second housing 210 moves in the first moving direction (direction ①) relative to the first housing 220 by a predetermined length d2, the length of the display area 2610 that is parallel with the first moving direction (direction ① may change to a second length d that is increased from a first length d1 by the predetermined length d2, and thereby, the display area 2610 may be extended. Similarly, while changing from the second state to the first state, when the second housing 210 moves in the second moving direction (direction ②) relative to the first housing 220 by the predetermined length d2, the length of the display area 2610 that is parallel with the second moving direction (direction ② may change to a first length d that is increased from the second length d by the predetermined length d2, and thereby, the display area 2610 may be reduced. Meanwhile, while the state of the electronic device 201 changes between the first state and the second state, the respective sizes of the second area 261B and the third area 261C may be substantially constant.

In an embodiment, the electronic device 201 may include at least one of an input module 250 (e.g., the input module 150 of FIG. 1), a sound output module (e.g., the sound output module 155 of FIG. 1), a camera module 280 (e.g., the camera module 180 of FIG. 1), or a connector port.

In an embodiment, the input module 250 may receive an input signal according to the manipulation of a user. The input module may be, for example, formed on the sixth side surface 220D of the first housing 220.

In various embodiments, a sound generated by the sound output module may be radiated through a first hole H1 formed in the second housing 210 and a second hole H2 formed in the first housing 220. In an embodiment, the first hole H1 and the second hole H2 may be disposed to be substantially aligned with each other when the electronic device 201 is in the first state.

Figure 3A:
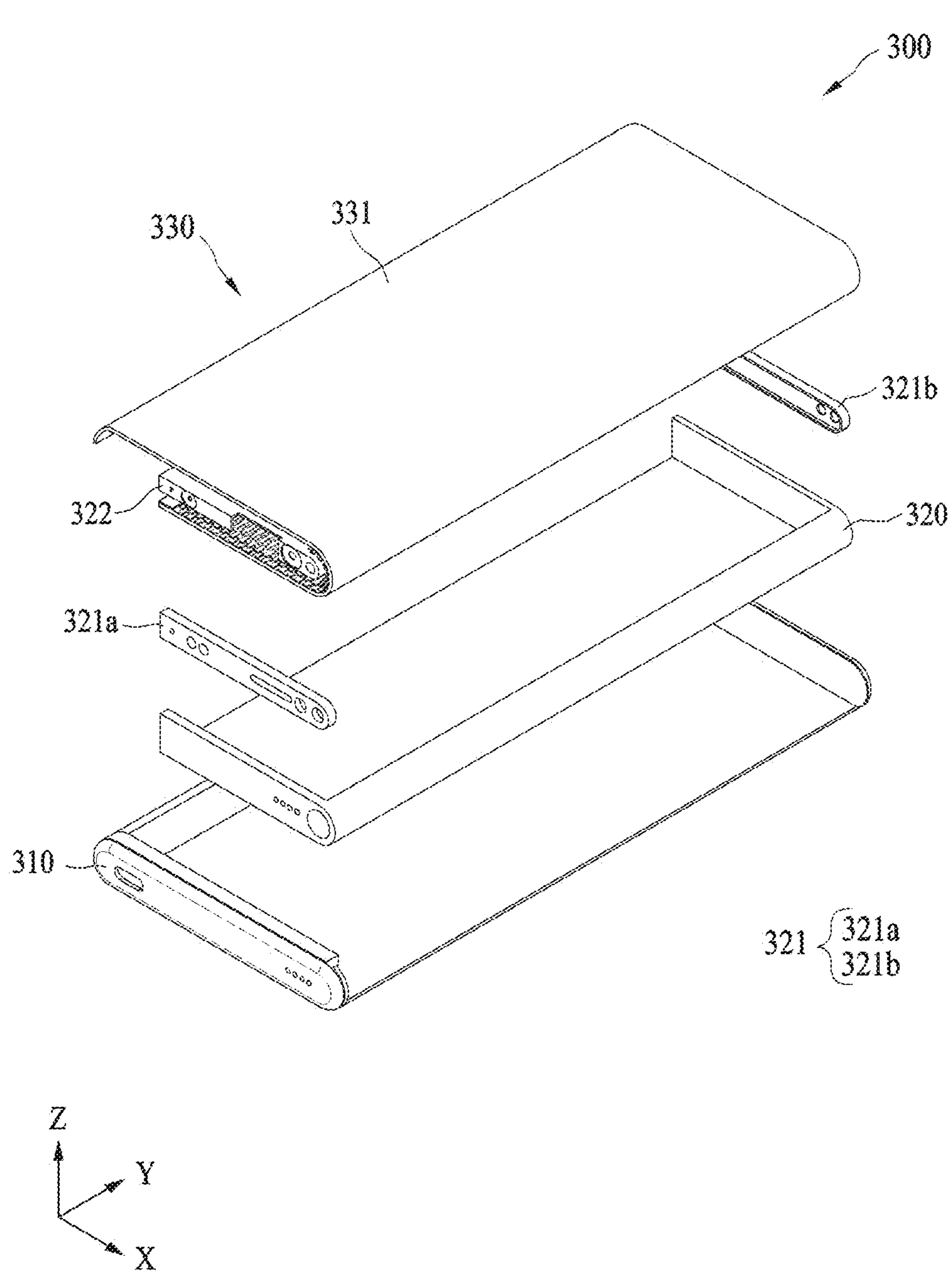
FIG. 3A is an exploded perspective view of an electronic device according to an embodiment.
Figure 3B:
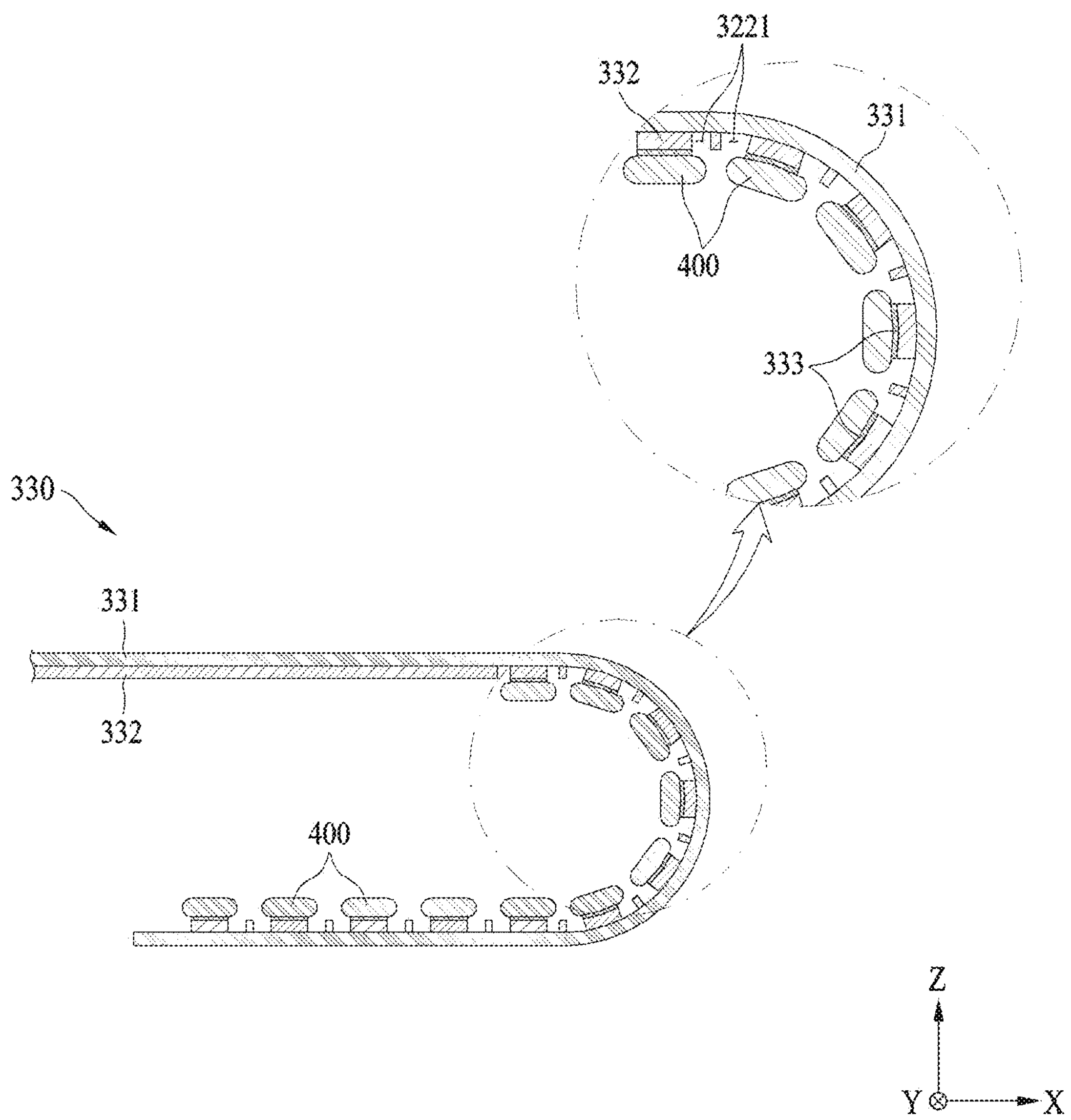
FIG. 3B is a cross-sectional view of a display module according to an embodiment.
Figure 3C:
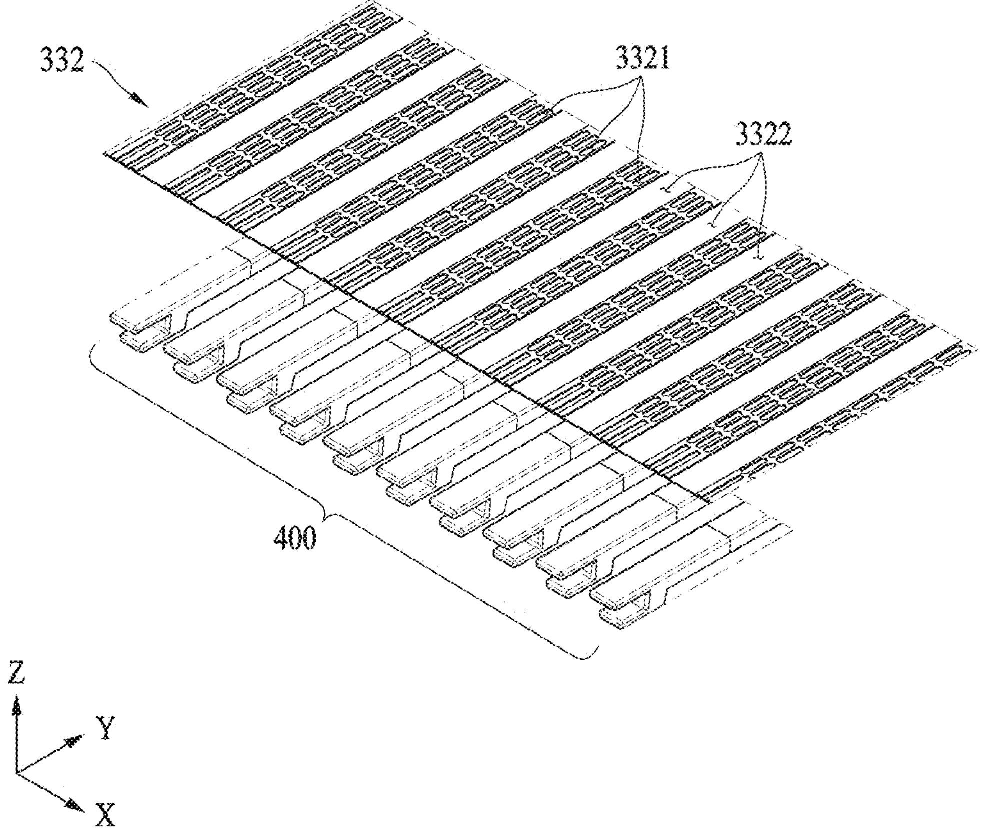
FIG. 3C is a partial perspective view of a state before a plurality of support structures is attached to a support plate according to an embodiment.
Figure 3D:
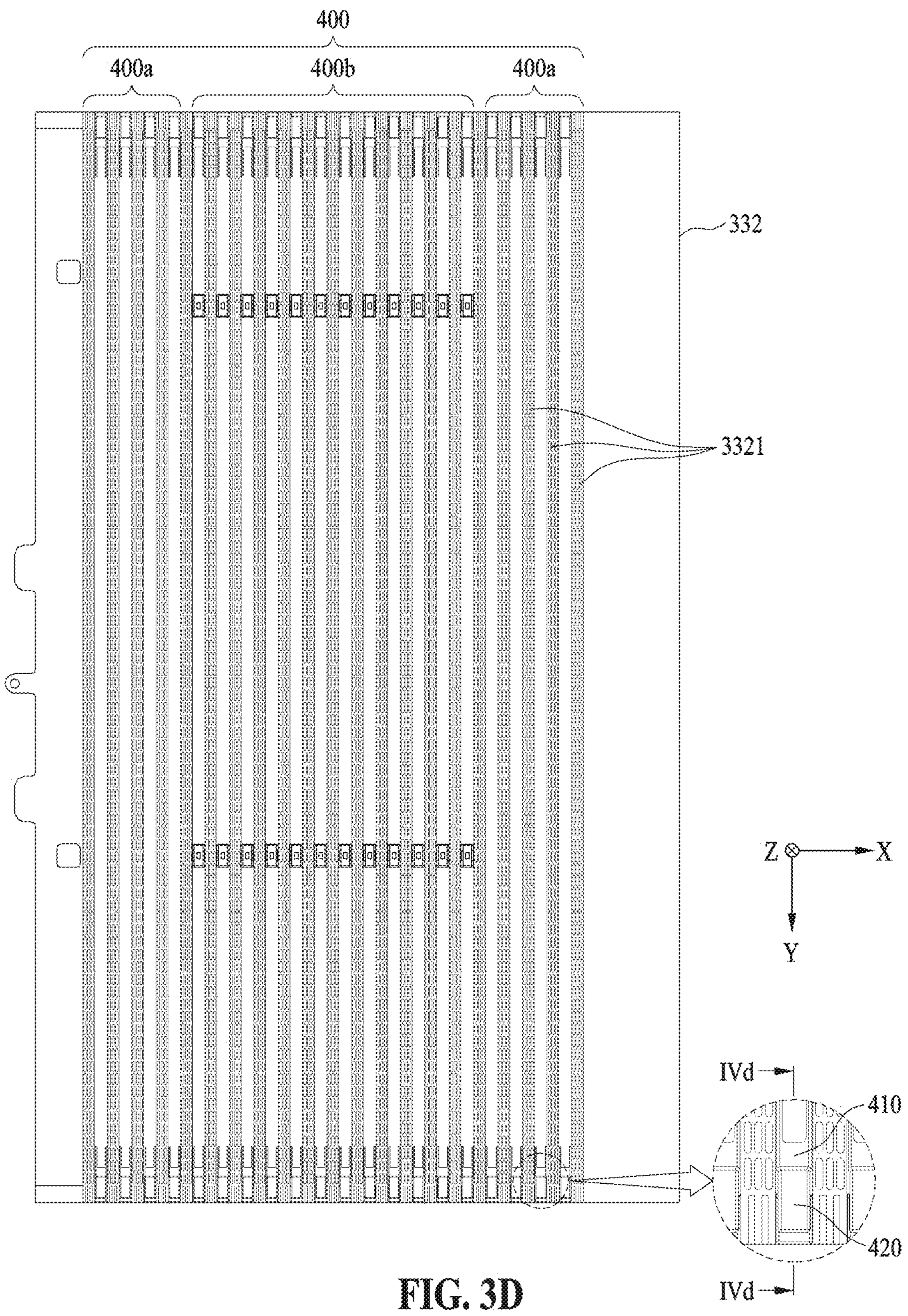
FIG. 3D is a plan view of a state in which a plurality of support structures is attached to a support plate according to an embodiment.
Figure 3E:
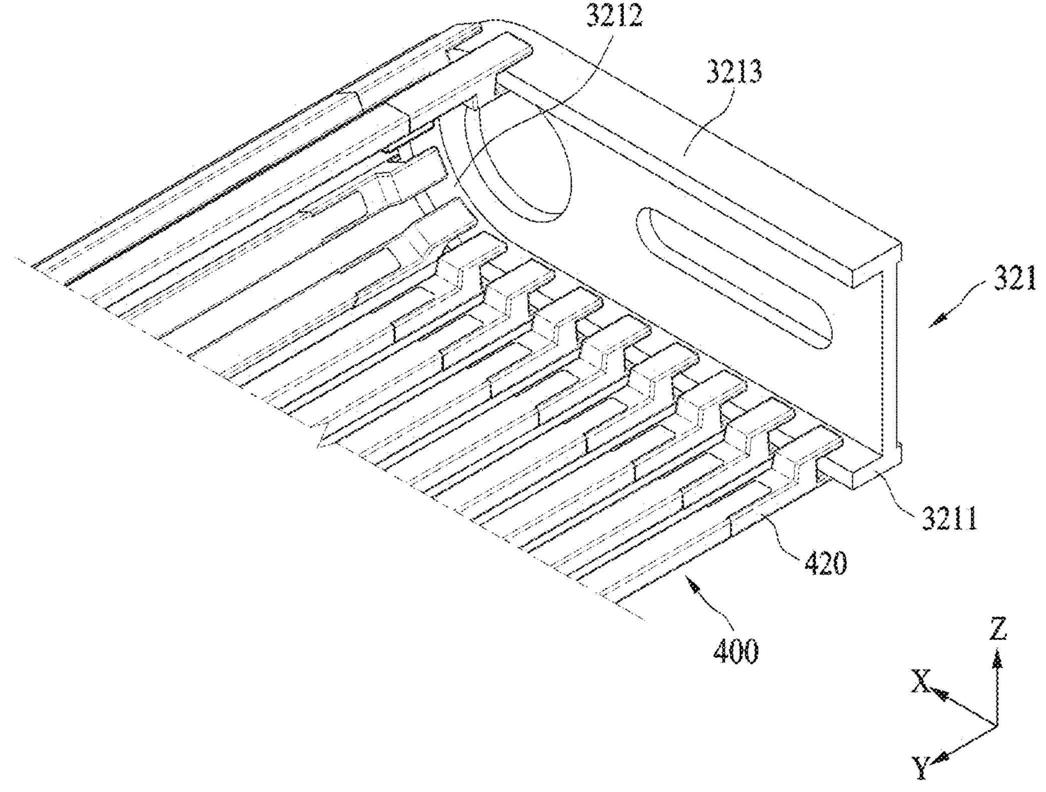
FIG. 3E is a perspective view of a state in which a plurality of support structures is coupled to a guide rail according to an embodiment.

FIG. 3A is an exploded perspective view of an electronic device according to an embodiment. FIG. 3B is a cross-sectional view of a display module according to an embodiment. FIG. 3C is a partial perspective view of a state before a plurality of support structures is attached to a support plate according to an embodiment. FIG. 3D is a plan view of a state in which a plurality of support structures is attached to a support plate according to an embodiment. FIG. 3E is a perspective view of a state in which a plurality of support structures is coupled to a guide rail according to an embodiment.

Referring to FIGS. 3A to 3E, an electronic device 300 (e.g., the electronic device 101 of FIG. 1 or the electronic device 201 of FIGS. 2A to 2D) in an embodiment may include a first housing 310 (e.g., the first housing 220 of FIG. 2A), a second housing 320 (e.g., the second housing 210 of FIG. 2B), one or more guide rails 321, a display module support member 322, and a display module 330 (e.g., the display 261 of FIG. 2A). For example, the electronic device 300 may be a rollable electronic device or a slidable electronic device.

In an embodiment, the first housing 310 may form at least a portion of an external figure of the electronic device 300. The first housing 310 may provide a space in which various electronic components are disposed. The second housing 320 may be slidably connected to the first housing 310. For example, the second housing 320 may be withdrawn from the first housing 310 in the +X direction or may be inserted into the first housing 310 in the −X direction. However, this is an example and the direction in which the second housing 320 is inserted or withdrawn is not limited thereto. The second housing 320 may be connected to the first housing 310 and may provide a space in which various electronic components are disposed.

In an embodiment, a guide rail 321 may guide a moving path of the display module 330 while the second housing 320 slides relative to the first housing 310. The guide rail 321 may be connected to the second housing 320 and may slide together with the second housing 320 relative to the first housing 310. At least one guide rail 321 may be provided. For example, a pair of guide rails 321*a* and 321*b* may be provided and may be disposed on both sides (e.g., −Y and +Y directions) of the second housing 320, respectively. For example, a first guide rail 321*a* may be connected to a lower end (e.g., an end in the −Y direction) of the second housing 320, and a second guide rail 321*b* may be connected to an upper end (e.g., an end in the +Y direction) of the second housing 320. However, this is an example, and the number and/or location of the guide rail 321 is not limited thereto.

In an embodiment, as shown in FIG. 3E, the guide rail 321 may include a first straight rail 3211, a curved rail 3212, and a second straight rail 3213. The first straight rail 3211 and the second straight rail 3213 may be formed in a direction (e.g., the X direction) in which the second housing 320 slides relative to the first housing 310. The first straight rail 3211 and the second straight rail 3213 may be spaced apart from each other in a thickness direction (e.g., the z direction) of the electronic device 300. For example, the second straight rail 3213 may be disposed to be relatively spaced apart in a front direction (e.g., the +Z direction) compared to the first straight rail 3211. The curved rail 3212 may continuously connect an end (e.g., an end in the +X direction) of the first straight rail 3211 to an end (e.g., an end in the +X direction) of the second straight rail 3213. However, this is an example and a rail shape of the guide rail 321 is not limited thereto.

In an embodiment illustrated in FIG. 3A, the display module support member 322 may support the display module 330 in a rear direction (e.g., the −Z direction). The display module support member 322 may be connected to the second housing 320 and may slide together with the second housing 320 relative to the first housing 310, an intermediate guide rail (e.g., an intermediate guide rail 323 of FIG. 4K) to be described below may be formed in the display module support member 322.

In an embodiment, the display module 330 may be supported by at least one of the first housing 310 and the second housing 320. For example, a portion of the display module 330 may be supported by the first housing 310 and the other portion thereof may be supported by the second housing 320. A display area of the display module 330 may change depending on the movement of the second housing 320 relative to the first housing 310. For example, when the second housing 320 is withdrawn from the first housing 310, more areas of a display panel 331 of the display module 330 may be visually exposed to the outside, and thereby, the display area may be expanded. When the second housing 320 is inserted into the first housing 310, an area of the display panel 331 of the display module 330 visually exposed to the outside may decrease, and thereby, the display area may be reduced.

In an embodiment, the display module 330 may include the display panel 331, a support plate 332, an adhesive member 333, and a plurality of support structures 400.

However, this is an example, and a configuration of the display module 330 is not limited thereto. For example, the display module 330 may include various layers, such as a cover layer and/or a touch panel.

In an embodiment, the display panel 331 may visually display information. At least a portion of the display panel 331 may be flexible. A display area of the display panel 331 visually exposed to the outside may change depending on the movement of the second housing 320 relative to the first housing 310. Hereinafter, for ease of description, based on the display panel 331, a direction in which information is displayed on the display panel 331 may be a front direction (e.g., the +z direction) and a direction that is opposite to the front direction (e.g., the +z direction) may be a rear direction.

In an embodiment, the support plate 332 may be disposed on a rear surface (e.g., a surface in the −z direction) of the display panel 331. The support plate 332 may support the display panel 331 in the rear direction (e.g., the −Z direction). The support plate 332 may be formed of a metal material. At least a portion of the support plate 332 may be bendable. For example, a grating structure 3321 may be formed on at least a portion of the support plate 332. The grating structure 3321 may include a plurality of openings formed in a predetermined pattern. For example, the plurality of openings may be formed in a longitudinal direction (e.g., the y direction) that is perpendicular to a direction in which the second housing 320 slides relative to the first housing 310. However, this is an example, and the shapes of the grating structure 3321 and/or the opening are not limited thereto. A plurality of grating structures 3321 may be provided, and each may be spaced apart from each other at a predetermined interval. A support structure 400 described below may be disposed on an area 3322 in which the grating structure 3321 is not formed.

In an embodiment, the adhesive member 333 may attach the support plate 332 to the plurality of support structures 400. The adhesive member 333 may attach the support structure 400 to the rear surface (e.g., a surface in the −Z direction) of the support plate 332. For example, the adhesive member 333 may include tape or glue. For example, the adhesive member 333 may include thermal pressure tape or pressure-sensitive adhesive. However, this is an example and the type of the adhesive member 333 is not limited thereto.

In an embodiment, the support structure 400 may be disposed on the rear surface (e.g., the surface in the −Z direction) of the support plate 332. The support structure 400 may be formed in the longitudinal direction (e.g., the Y direction). For example, the longitudinal direction (e.g., the Y direction) of the support structure 400 may be perpendicular to a direction (e.g., the X direction) in which the second housing 320 slides relative to the first housing 310. A plurality of support structures 400 may be provided and may be spaced apart from each other. For example, the support structure 400 may each be disposed between the grating structure 3321 formed in the support plate 332. The support structure 400 may support the display panel 331 and the support plate 332 in the rear direction (e.g., the −z direction) and may slide along the guide rail 321. For example, one or more guide heads 420 of the support structure 400 may slide along the first straight rail 3211, the curved rail 3212, and the second straight rail 3213 of the guide rail 321.

In an embodiment, as shown in FIG. 3D, the support structure 400 may include a first support structure 400*a* and a second support structure 400*b*. One or more first support structures 400*a* or one or more second support structures 400*b* may be provided. However, the numbers and/or the arrangement relationships of the first support structure 400*a* and the second support structure 400*b* shown in FIG. 3D are examples and are not limited thereto. For example, the support structure 400 may include only the first support structure 400*a* or only the second support structure 400*b*.

Figure 4A:
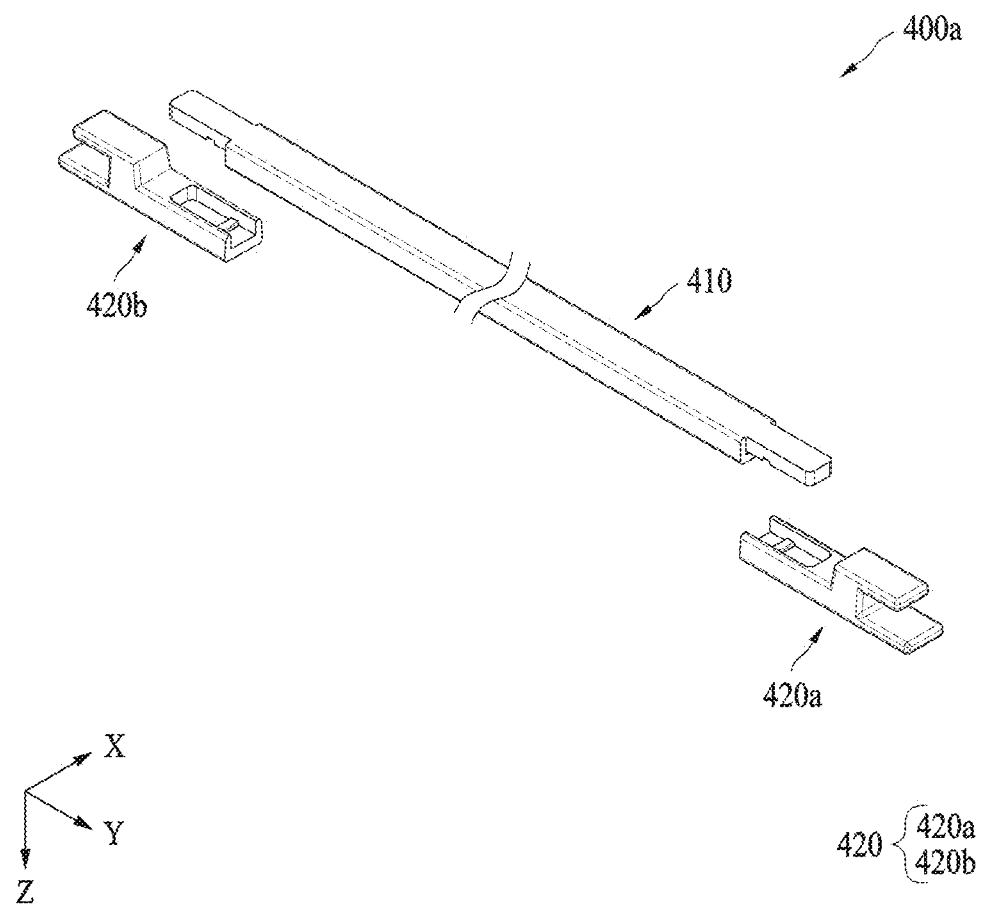
FIG. 4O is an exploded perspective view of a first support structure according to an embodiment.
FIG. 4B is a perspective view of an end of a support bar according to an embodiment.
FIG. 4C is a perspective view of a guide head according to an embodiment.
FIG. 4D is a cross-sectional view of a guide head and a support bar attached to a support plate according to an embodiment.
FIG. 4E is a display module according to a comparative embodiment and is a cross-sectional view of an end of a support structure attached to a support plate.
FIG. 4F is a perspective view of a guide head according to an embodiment.
FIG. 4G is a perspective view of a guide head according to an embodiment.
FIG. 4H is an exploded perspective view of a second support structure according to an embodiment.
FIG. 4I is an enlarged perspective view of an intermediate guide head portion of the second support structure according to an embodiment.
FIG. 4J is a cross-sectional view of the intermediate guide head portion of the second support structure according to an embodiment.
FIG. 4K is a perspective view of a state in which the intermediate guide head is coupled to an intermediate guide rail according to an embodiment.
FIG. 4L is a perspective view of an end of a support bar according to an embodiment.
FIG. 4M is a perspective view of a guide head according to an embodiment.
FIG. 4N is a cross-sectional view of a guide head and a support bar attached to a support plate according to an embodiment.
Figure 4B:
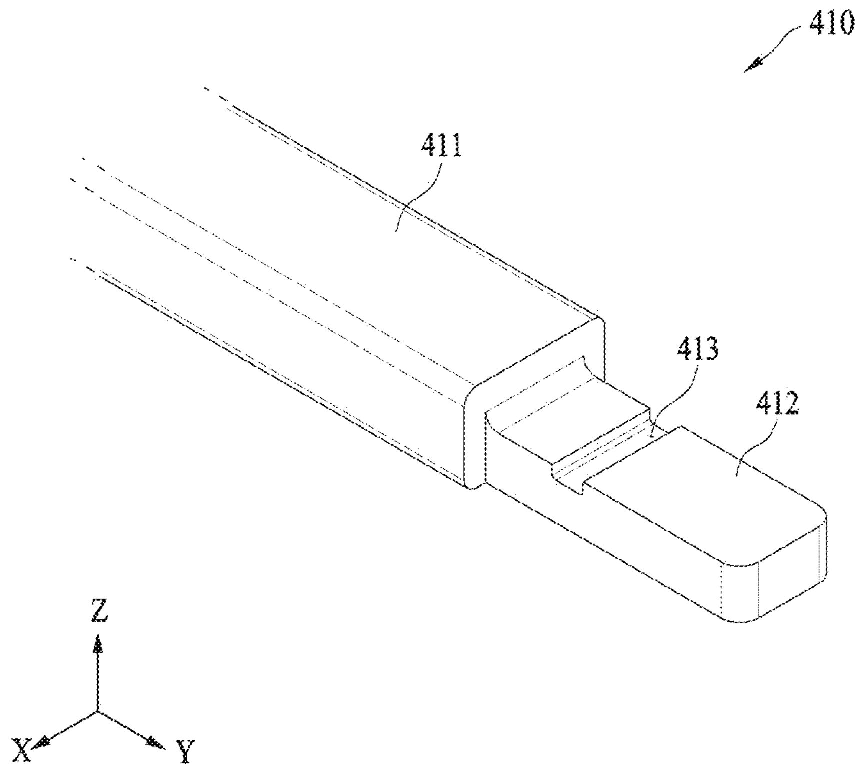
Figure 4C:
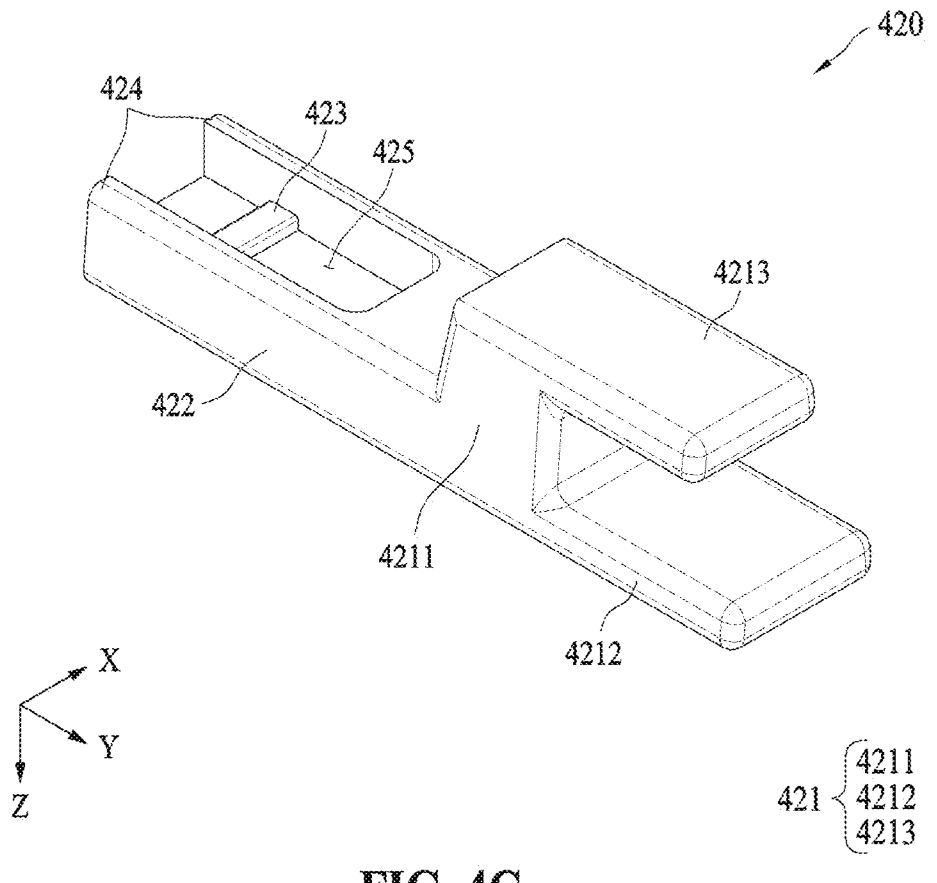
Figure 4D:
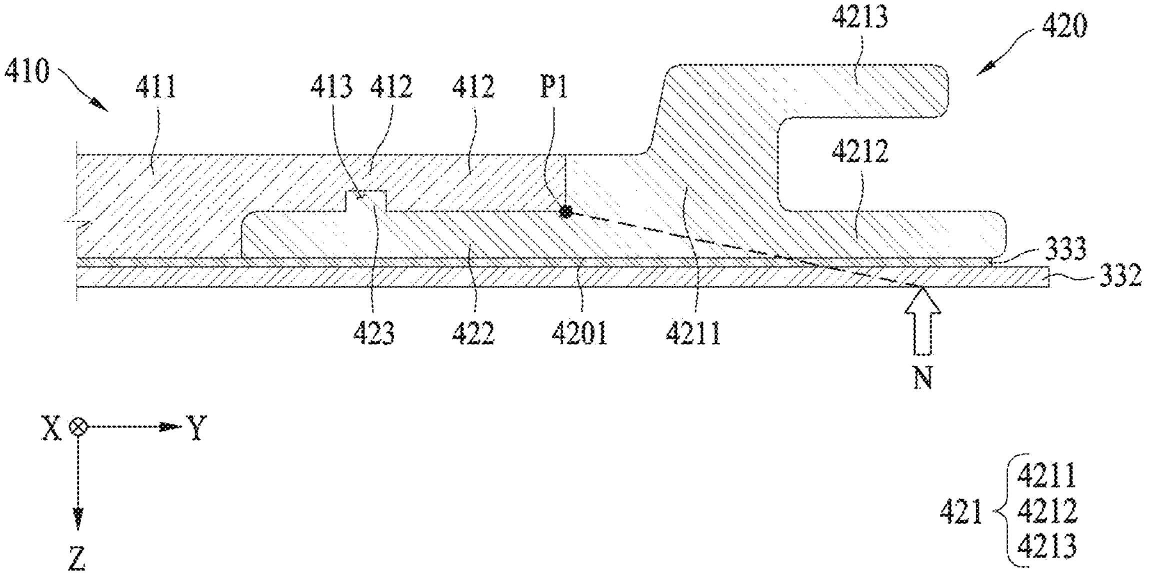
Figure 4E:
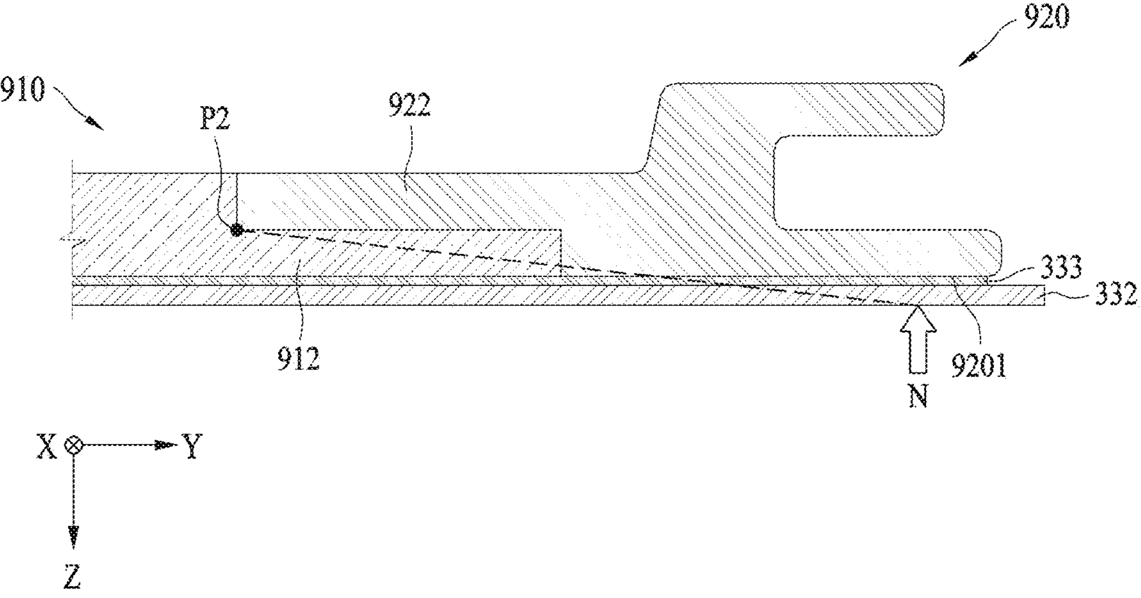
Figure 4F:
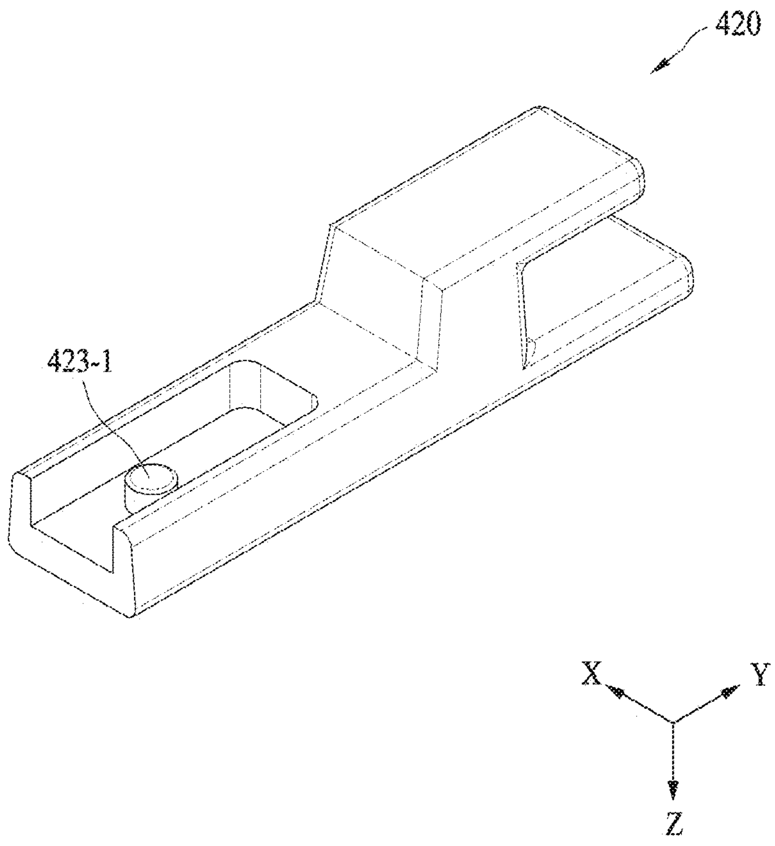
Figure 4G:
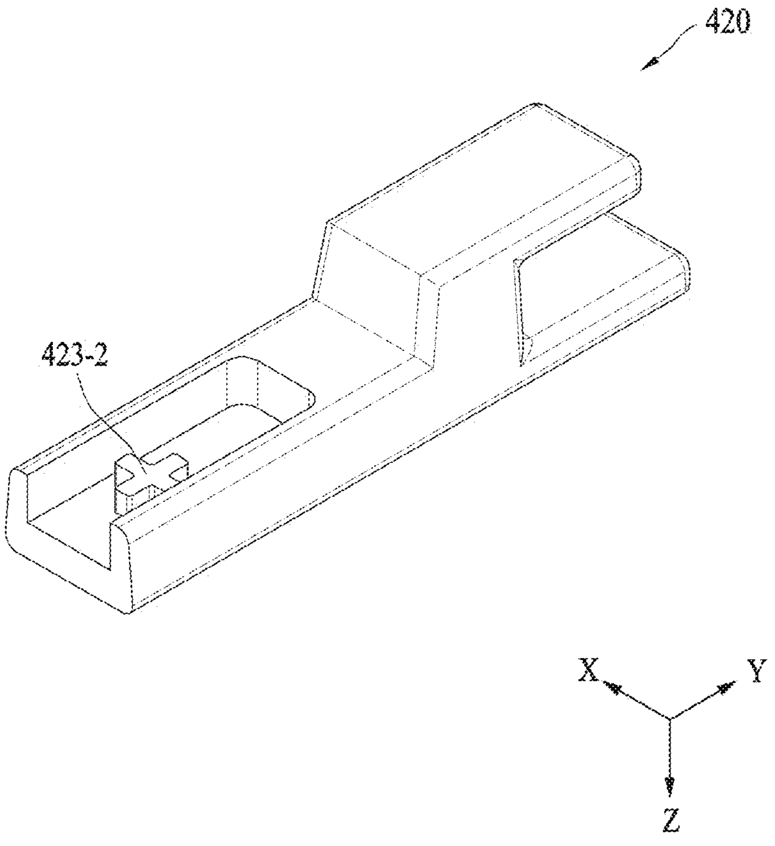
Figure 4H:
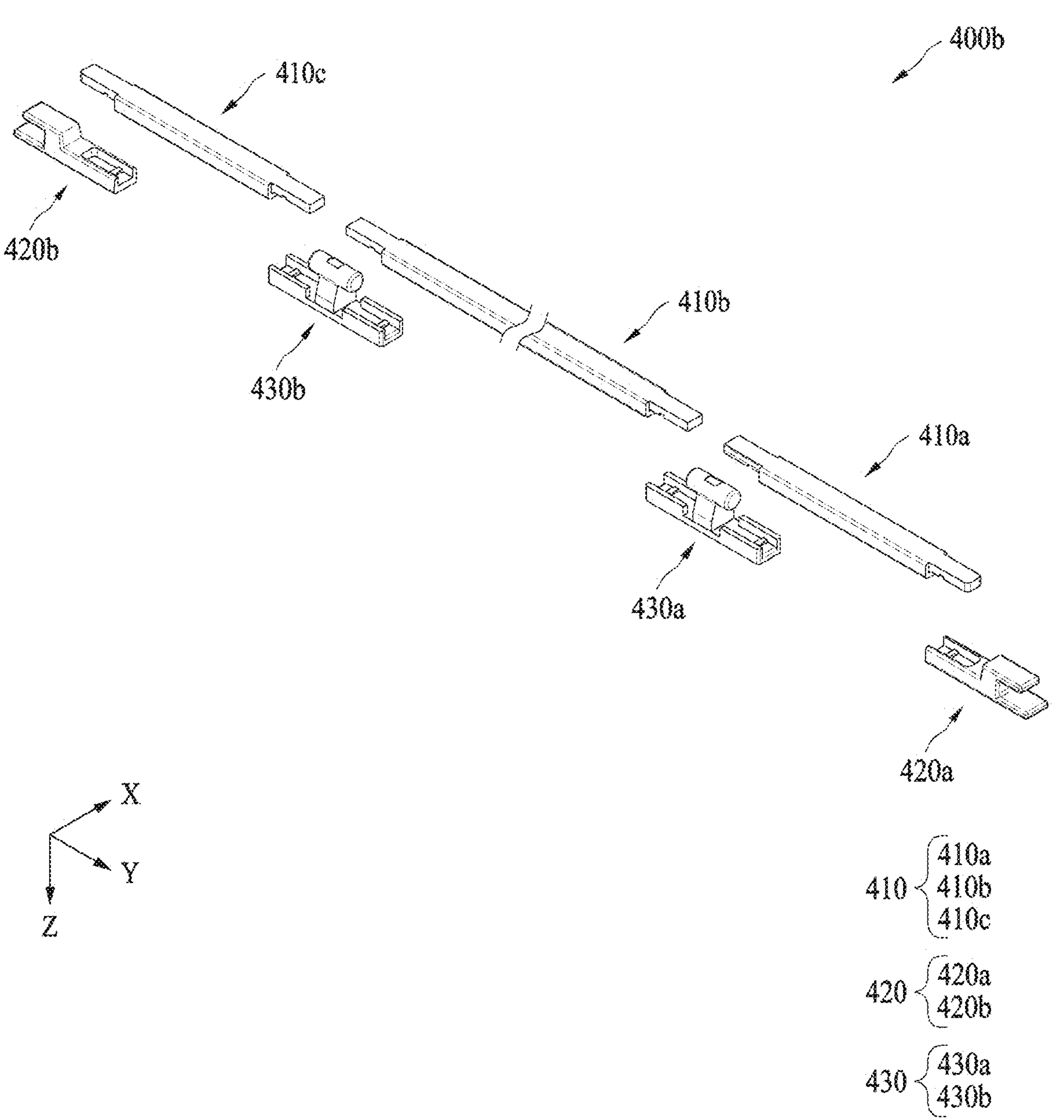
Figure 4I:
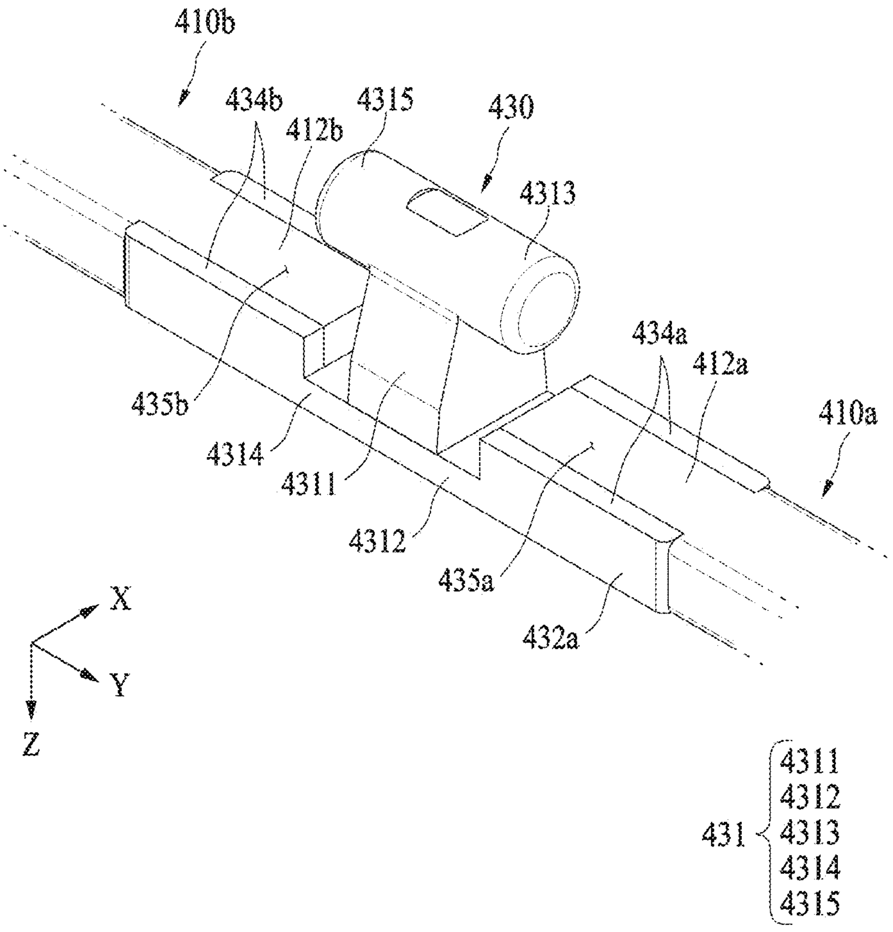
Figure 4J:
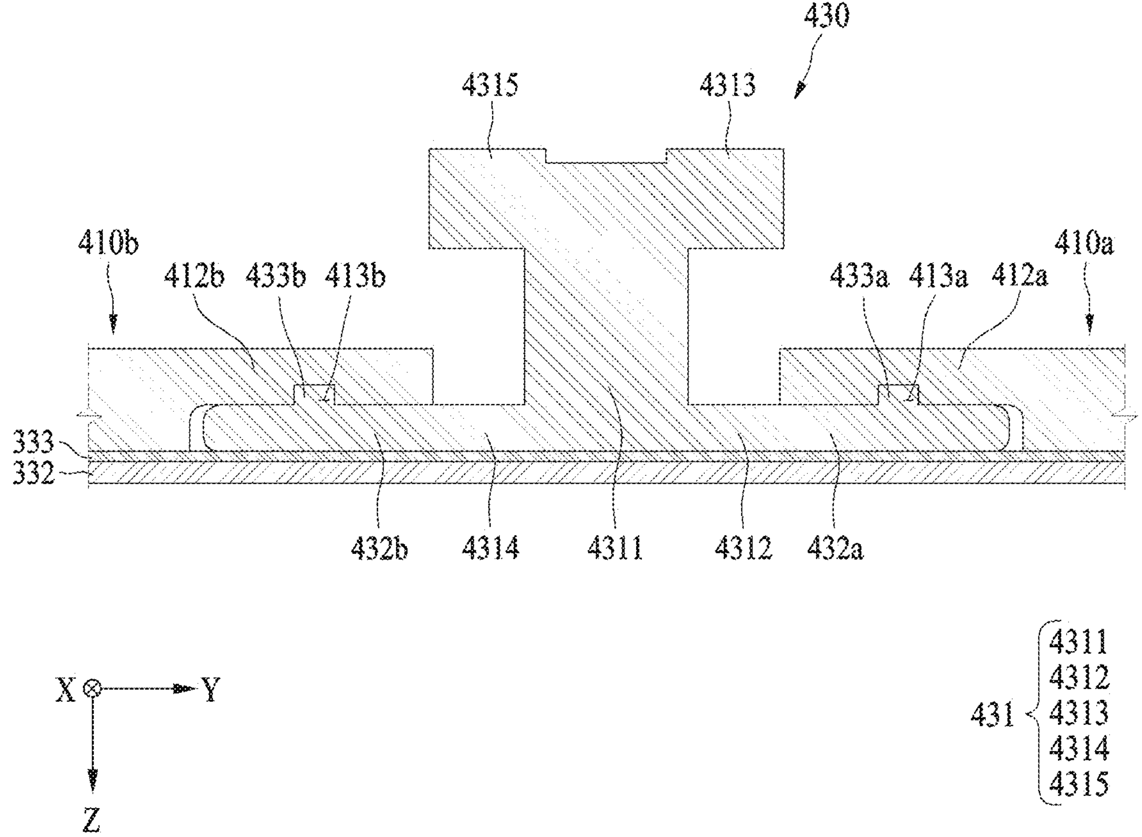
Figure 4K:
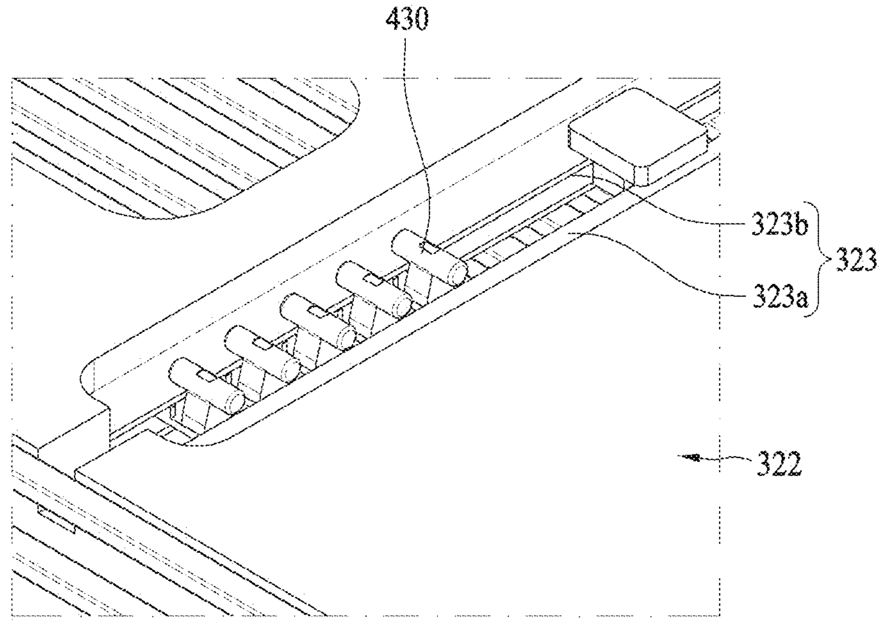
Figure 4K:
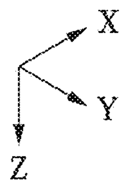
Figure 4L:
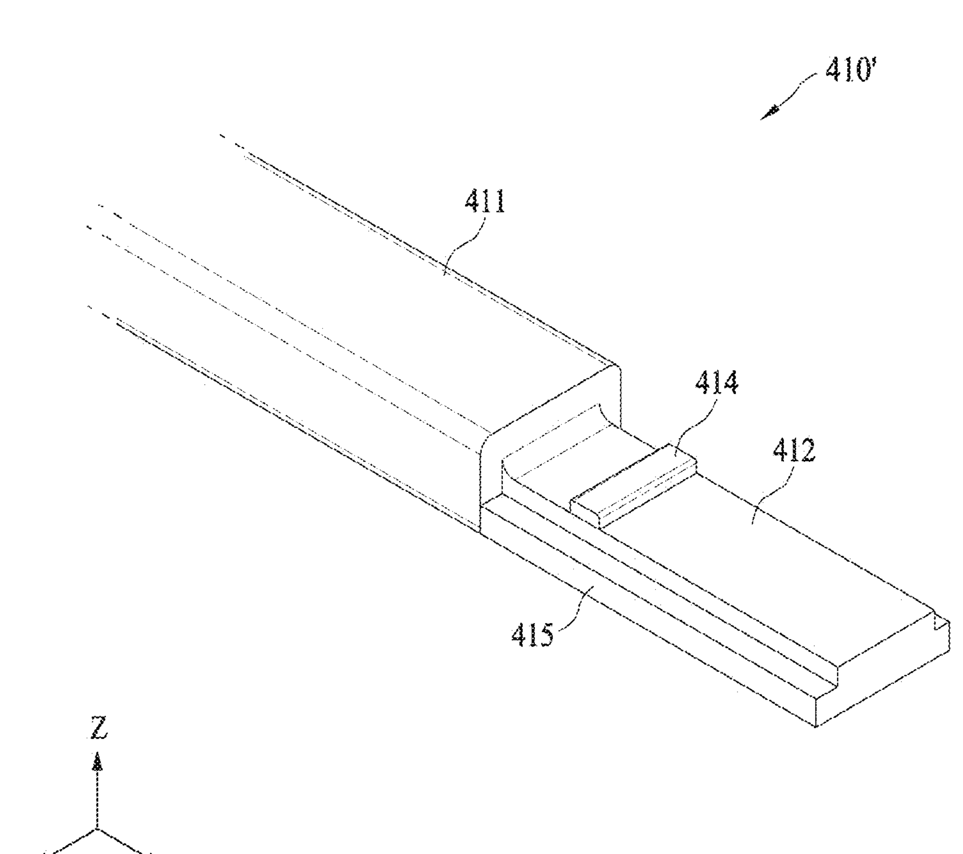
Figure 4M:
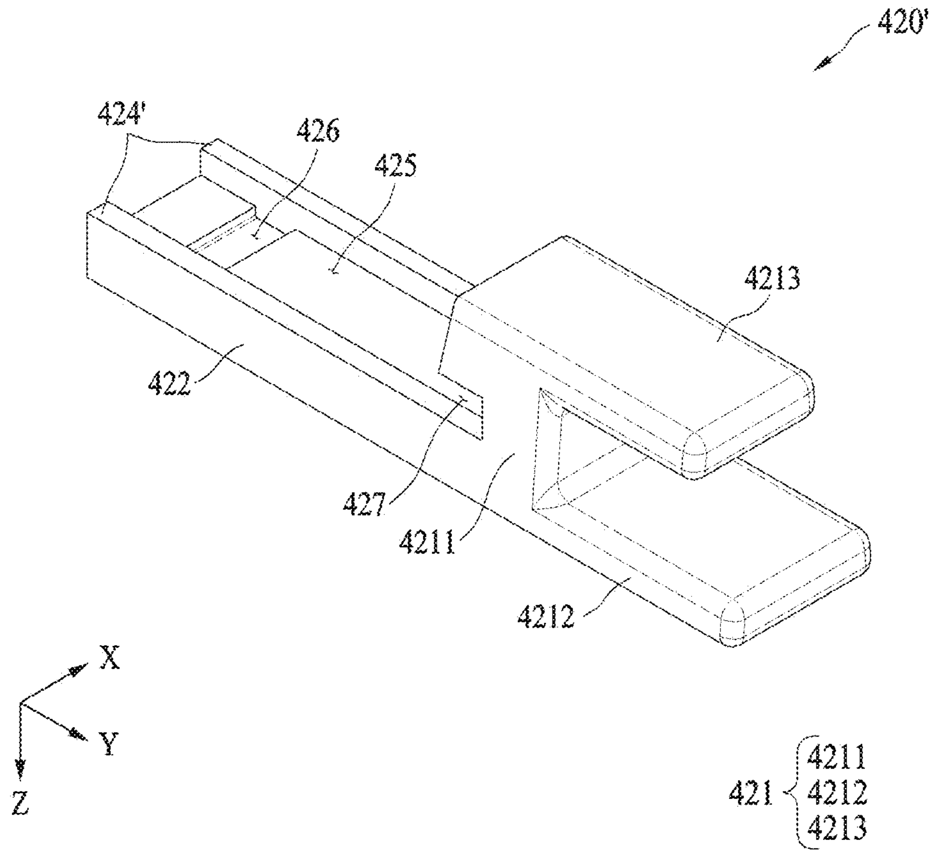
Figure 4N:
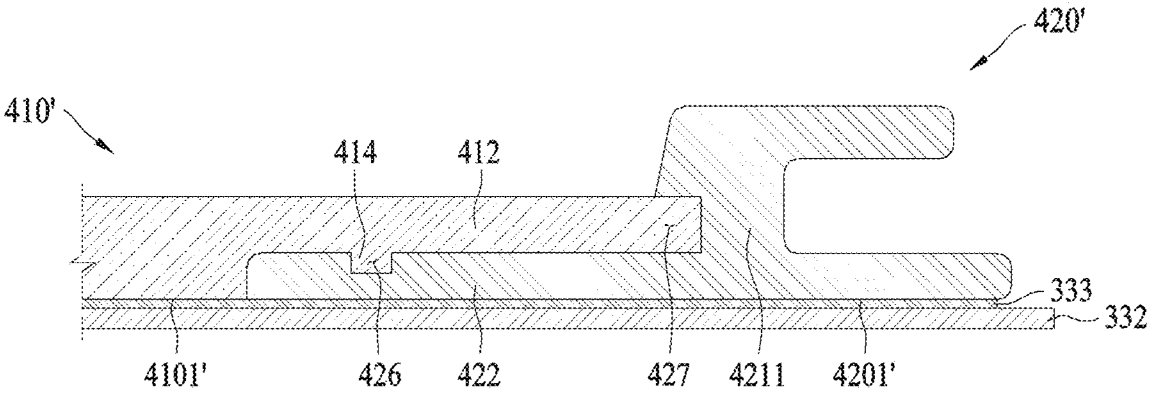
Figure 4N:
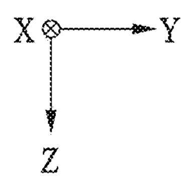
Figure 4O:
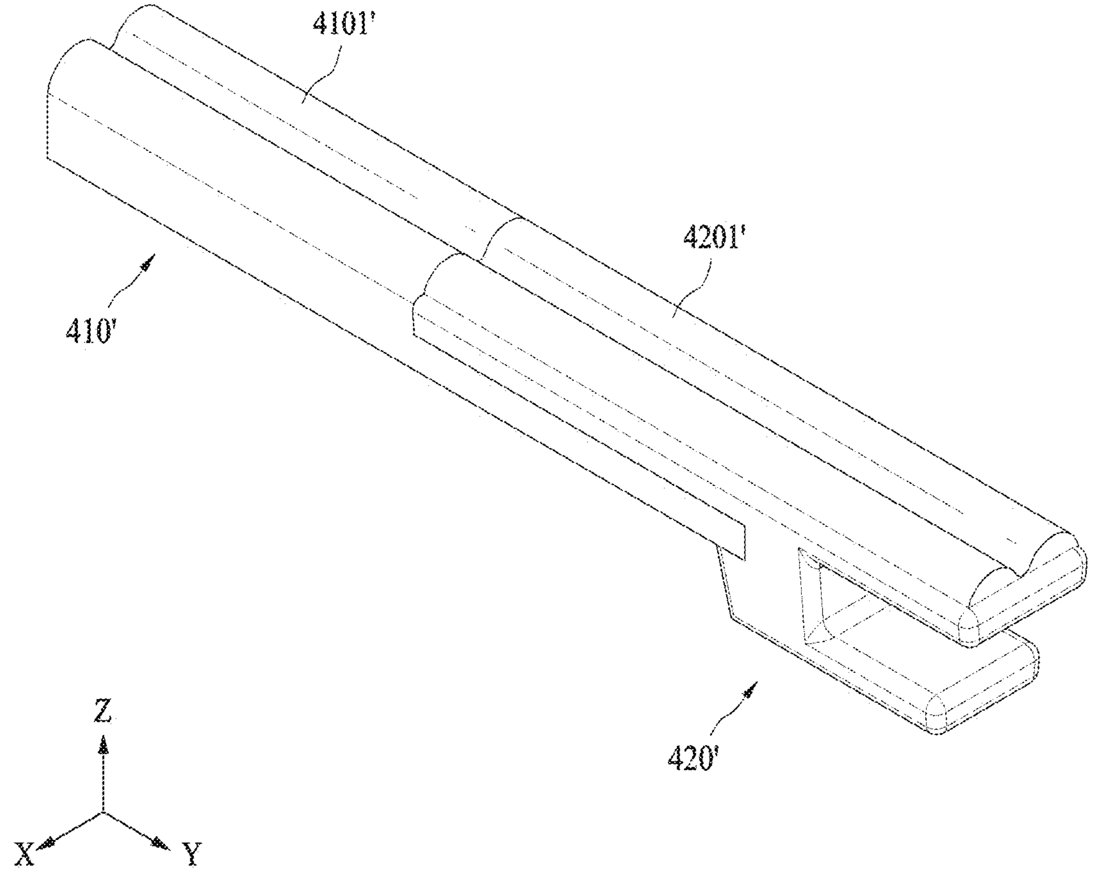

FIG. 4O is an exploded perspective view of a first support structure according to an embodiment. FIG. 4B is a perspective view of an end of a support bar according to an embodiment. FIG. 4C is a perspective view of a guide head according to an embodiment. FIG. 4D is a cross-sectional view (e.g., a cross-sectional view taken along line VId-VId of FIG. 3D) of a guide head and a support bar attached to a support plate according to an embodiment.

Referring to FIGS. 4A to 4D, the first support structure 400*a* in an embodiment may include a support bar 410 and the guide head 420.

In an embodiment, the support bar 410 may be formed in a longitudinal direction (e.g., the Y direction). For example, the longitudinal direction (e.g., the Y direction) of the support bar 410 may be perpendicular to a direction (e.g., the X direction) in which a second housing (e.g., the second housing 320 of FIG. 3A) is inserted into or withdrawn from a first housing (e.g., the first housing 310 of FIG. 3A). The support bar 410 may be attached to a rear surface (e.g., a surface in the −Z direction) of a support plate (e.g., the support plate 332 of FIG. 3B) and may support the support plate 332 and a display panel (e.g., the display panel 331 of FIG. 3B). For example, the support bar 410 may be formed through a rolling process. However, this is an example and the processing method of the support bar 410 is not limited thereto.

In an embodiment, the support bar 410 may include a bar portion 411, a connecting part 412, and a recessed groove 413.

In an embodiment, the bar portion 411 may be a portion of the support bar 410 in the longitudinal direction (e.g., the Y direction). For example, the bar portion 411 may be formed as a bar shape having a substantially rectangular cross-section. However, this is an example, and the shape of the bar portion 411 is not limited thereto.

In an embodiment, the connecting part 412 may extend in the longitudinal direction (e.g., the y direction) of the bar portion 411 from both ends (e.g., an end in the +Y direction and an end in the −Y direction) of the bar portion 411. The connecting part 412 may extend from an end of the bar portion 411 to have a smaller cross-sectional area than a cross-sectional area of the bar portion 411. For example, a Z-direction height of the connecting part 412 may be less than a Z-direction height of the bar portion 411. For example, a X-direction width of the connecting part 412 may be less than a Z-direction width of the bar portion 411. Based on a view of the support bar 410 in the −Y direction, the connecting part 412 may be formed on a rear direction (e.g., the −Z direction) side of the bar portion 411. For example, as shown in FIG. 4D, the rear surface (e.g., the surface in the −Z direction) of the connecting part 412 may be formed as substantially the same surface as the rear surface (e.g., the surface in the −Z direction) of the bar portion 411.

The connecting part 412 may be a part to be connected to the guide head 420 described below. The connecting part 412 may be seated on the rear surface (e.g., the surface in the −Z direction) of an extension 422 of the guide head 420.

In an embodiment, the recessed groove 413 may be recessed from the front surface (e.g., the surface in the +Z direction) of the connecting part 412. For example, the recessed groove 413 may be formed in a direction (e.g., the X direction) that is perpendicular to the longitudinal direction (e.g., the Y direction) of the support bar 410. A protrusion 423 of the guide head 420 (see e.g., FIG. 4C) described below may be inserted into the recessed groove 413.

In an embodiment, the guide head 420 may be disposed on both ends (e.g., an end in the +Y direction and an end in the −Y direction) of the support bar 410. For example, a pair of guide heads 420 may be provided. A first guide head 420*a* may be disposed on one end (e.g., the end in the +Y direction) of the support bar 410, and a second guide head 420*b* may be disposed on the other end (e.g., the end in the −Y direction) of the support bar 410. As shown in FIG. 3E, the guide head 420 may slide along a guide rail (e.g., the guide rail 321 of FIG. 3E). For example, the first guide head 420*a* may be slidably connected to a first guide rail (e.g., the first guide rail 321*a* of FIG. 3A) and the second guide head 420*b* may be slidably connected to a second guide rail (e.g., the second guide rail 321*b* of FIG. 3A). For example, the guide head 420 may be formed by metal injection molding. However, this is an example and the manufacturing method of the guide head 420 is not limited thereto.

In an embodiment, the guide head 420 may include a guide portion 421, the extension 422, the protrusion 423, and a pair of side walls 424.

In an embodiment, the guide portion 421 may slide along a guide rail (e.g., the guide rail 321 of FIG. 3E). The guide portion 421 may include a head body 4211, a first guide body 4212, and a second guide body 4213. The head body 4211 may be a portion disposed on a substantially central portion of the guide head 420. The first guide body 4212 and the second guide body 4213 may be spaced apart from each other and may extend from one side portion (e.g., a portion in the +y direction) of the head body 4211. For example, the second guide body 4213 may be disposed to be relatively spaced apart in the rear direction (e.g., the −Z direction) compared to the first guide body 4212. For example, as shown in FIG. 4D, the front surface (e.g., the surface in the +Z direction) of the first guide body 4212 may be formed as substantially the same surface as the front surface (e.g., the surface in the +Z direction) of the head body 4211. A first straight rail (e.g., the first straight rail 3211 of FIG. 3E), a curved rail (e.g., the curved rail 3212 of FIG. 3E), and a second straight rail (e.g., the second straight rail 3213 of FIG. 3E) may be disposed between the first guide body 4212 and the second guide body 4213.

In an embodiment, the extension 422 may extend from an end (e.g., an end in the −Y direction) of the guide portion 421. For example, the extension 422 may extend from the other side portion (e.g., a portion in the −Y direction) of the head body 4211. Based on a view of the guide head 420 in the +Y direction, the extension 422 may be formed in the front direction (e.g., the +Z direction) side of the head body 4211. For example, as shown in FIG. 4D, the front surface (e.g., the surface in the +Z direction) of the extension 422 may be formed as substantially the same surface as the front surface (e.g., the surface in the +Z direction) of the head body 4211. For example, a Z-direction height of the extension 422 may be less than a Z-direction height of the other side portion (e.g., the portion in the −y direction) of the head body 4211.

In an embodiment, the connecting part 412 of the support bar 410 may be seated on the extension 422. For example, the connecting part 412 may be seated on the extension 422 such that the rear surface (e.g., the surface in the −Z direction) of the extension 422 is in contact with the front surface (e.g., the surface in the +Z direction) of the connecting part 412. According to the structure described above, while the guide head 420 and the support bar 410 are attached to the support plate 332, at least a portion of the extension 422 may be positioned between the connecting part 412 and the support plate 332. While the guide head 420 and the support bar 410 are attached to the support plate 332, the extension 422 may be positioned in the relatively front direction (e.g., the +Z direction) compared to the connecting part 412.

In an embodiment, the protrusion 423 may protrude from the rear surface (e.g., the surface in the −Z direction) of the extension 422. For example, the protrusion 423 may be formed in a perpendicular direction (e.g., the X direction) to the longitudinal direction (e.g., the Y direction) of the support bar 410. The protrusion 423 may be inserted into the recessed groove 413 formed in the connecting part 412. The protrusion 423 may be formed in a position and/or a shape corresponding to the recessed groove 413. When the extension 422 and the connecting part 412 are connected to each other, as the protrusion 423 is inserted into the recessed groove 413, a relative position between the extension 422 and the connecting part 412 may be guided. However, this is an example, and as shown in FIG. 4N, a recessed groove (e.g., a recessed groove 426 of FIG. 4N) may be formed in the extension 422, and a protrusion (e.g., a protrusion 414 of FIG. 4N) may be formed in the connecting part 412.

In an embodiment shown in FIG. 4C, the pair of side walls 424 may extend in the rear direction (e.g., the −Z direction) from both side ends (e.g., an end in the +X direction and an end in the −X direction) of the width direction (e.g., the X direction) of the extension 422. For example, the pair of side walls 424 may substantially extend from the rear surface (e.g., the surface in the −Z direction) of the extension 422 to the height corresponding to the Z-direction height of the other side portion (e.g., a portion in the −Y direction) of the head body 4211. As the pair of side walls 424 is formed on both ends (e.g., the end in the +X direction and the end in the −X direction) of the extension 422, a seating space 425 on which the connecting part 412 is seated may be formed. The seating space 425 may be formed as a shape substantially corresponding to the connecting part 412. While the connecting part 412 is seated on the seating space 425, the pair of side walls 424 may support side surfaces (e.g., the surface in the +X direction and the surface in the −X direction) in the width direction of the connecting part 412.

With continued reference to FIGS. 3A to 4D, in an embodiment, the support structure 400 may be attached to the rear surface (e.g., the surface in the −Z direction) of the support plate 332 through the adhesive member 333. For example, the plurality of support structures 400 may be attached to the support plate 332 by using a jig in which a plurality of grooves is spaced apart from each other to insert the plurality of support structures 400 therein. For example, the support bar 410 may be inserted into each groove of the jig and the guide head 420 may be positioned on both ends of the support bar 410 such that the connecting part 412 is seated on the extension 422. During this process, as the protrusion 423 is inserted into the recessed groove 413 (see e.g., FIG. 4D), the relative position between the support bar 410 and the guide head 420 may be guided, and thereby, the jig seating convenience and/or assembly convenience may be improved. While the support bar 410 and the guide head 420 are inserted into each groove of the jig, after applying the adhesive member 333 between the rear surface (e.g., the surface in the −Z direction) of the support plate 332 and the front surfaces (e.g., the surface in the +Z direction) of the guide head 420 and the support bar 410, the support bar 410 and the guide head 420 may be bonded to the support plate 332 by thermocompression bonding. According to the process described above, even if a separate welding process is performed between the support bar 410 and the guide head 420, the support bar 410 and the guide head 420 may be bonded to the support plate 332 through the common adhesive member 333. Since the welding process to connect the support bar 410 and the guide head 420 to each other, an event (e.g., misalignment or height difference) occurring during the welding process may be reduced. Even if a material swells during the thermocompression bonding process, misalignment of the position of the guide head 420 relative to the support bar 410 may be reduced by the coupling between the protrusion 423 and the recessed groove 413. As another example, a welding process to connect the support bar 410 and the guide head 420 to each other may be included and an event (e.g., misalignment or height difference) occurring during the welding process may be reduced. As a result, the yield and surface quality of the display module 330 may be improved by the structure described above. However, the process described above is an example, and a process of attaching the support structure 400 to the support plate 332 is not limited thereto.

FIG. 4E is a display module according to a comparative embodiment and is a cross-sectional view of an end of a support structure attached to a support plate.

Referring to FIG. 4D, in an embodiment, at least a portion of the extension 422 of the guide head 420 may be positioned between the support plate 332 and the connecting part 412 of the support bar 410. In an embodiment, the extension 422 of the guide head 420 may be disposed in the front direction (e.g., the +Z direction) compared to the connecting part 412 of the support bar 410. In addition, in a comparative embodiment of FIG. 4E, an extension 922 of a guide head 920 may be disposed in the rear direction (e.g., the −Z direction) compared to a connecting part 912 of a support bar 910.

Referring to FIG. 4D, in an embodiment, a normal force N may be applied to the guide head 420 disposed on the end of the support bar 410 by a repulsive force of a display panel (e.g., the display panel 331 of FIG. 3A). For example, when the repulsive force of the display panel 331 is generated in the front direction (e.g., the +Z direction), the guide head 420 may receive the normal force N in the rear direction (e.g., the −Z direction). The normal force N may function as a force to remove the guide head 420 from the support bar 410.

In the structure of the embodiment of FIG. 4D, since the extension 422 of the guide head 420 is positioned in the relatively front direction (e.g., the +Z direction) compared to the connecting part 412 of the support bar 410, a position of a fulcrum P1 with respect to the normal force N from a position to which the normal force N is applied may be relatively close. Meanwhile, in the comparative embodiment of FIG. 4E, since the extension 922 of the guide head 920 is positioned in the relatively rear direction (e.g., the −Z direction) compared to the connecting part 912 of the support bar 910, a position of a fulcrum P2 with respect to the normal force N from the position to which the normal force N is applied may be relatively far. Therefore, when the same normal force N is applied, a relatively smaller torque may be applied to the guide head 420 in the structure of the embodiment (shown in FIG. 4D) than the structure of the comparative embodiment (shown in FIG. 4E). Accordingly, in the structure of the embodiment, an influence by the repulsive force of the display panel (e.g., the display panel 331 of FIG. 3A) may be reduced, and thus, the coupling stability between the guide head 420 and the support bar 410 may be improved.

In the structure of the embodiment, since the protrusion 423 is inserted into the recessed groove 413, separation of the guide head 420 from the support bar 410 may be restricted by the coupling of the protrusion 423 and the recessed groove 413, and thereby, the coupling stability between the guide head 420 and the support bar 410 may be improved.

In an embodiment, since the extension 422 of the guide head 420 is positioned in the front direction (e.g., the +Z direction) of the connecting part 412 of the support bar 410, a front surface 4201 of the guide head 420 in the embodiment may have a wider area than a front surface 9201 of the guide head 920 in a comparative embodiment. Accordingly, since the guide head 420 may be bonded to the support plate 332 over a wider area in the structure of the embodiment than the structure of the comparative embodiment, the bonding stability between the guide head 420 and the support plate 332 may be improved.

FIG. 4F is a perspective view of a guide head according to an embodiment. FIG. 4G is a perspective view of a guide head according to an embodiment.

Referring to FIG. 4F, in an embodiment, a protrusion 423-1 of the guide head 420 may have a substantially circular cross-section. In this case, a recessed groove (e.g., the recessed groove 413 of FIG. 4B) of a support bar (e.g., the support bar 410 of FIG. 4B) may be formed as a shape corresponding to the protrusion 423-1.

Referring to FIG. 4G, in an embodiment, a protrusion 423-2 of the guide head 420 may have a Y-direction and an X-direction. For example, the protrusion 423-2 may be formed to have a substantially cross-shaped cross-section. In this case, a recessed groove (e.g., the recessed groove 413 of FIG. 4B) of a support bar (e.g., the support bar 410 of FIG. 4B) may be formed as a shape corresponding to the protrusion 423-1.

However, the shapes of the protrusions 423-1 and 423-2 shown in FIGS. 4F and 4G are examples and the shapes of the protrusions 423-1 and 423-2 are not limited thereto.

FIG. 4H is an exploded perspective view of a second support structure according to an embodiment. FIG. 4I is an enlarged perspective view of an intermediate guide head portion of the second support structure according to an embodiment. FIG. 4J is a cross-sectional view of the intermediate guide head portion of the second support structure according to an embodiment. FIG. 4K is a perspective view of a state in which the intermediate guide head is coupled to an intermediate guide rail according to an embodiment.

Referring to FIGS. 4H to 4K, the second support structure 400*b* in an embodiment may include the support bar 410, the guide head 420, and an intermediate guide head 430. For example, the second support structure 400*b* may further include the intermediate guide head 430 than a first support structure (e.g., the first support structure 400*a* of FIG. 4O). The intermediate guide head 430 may be disposed in the middle of the support bar 410 and may reduce lifting of a display panel (e.g., the display panel 331 of FIG. 3A). For example, the intermediate guide head 430 may be disposed in a position in which the display panel 331 is likely to be lifted. For example, as shown in FIG. 3D, the intermediate guide head 430 may be disposed at two locations in the middle of the support bar 410, and the second support structure 400*b* may be disposed in the central portion relative to the x direction among the plurality of support structures 400. However, this is an example, and the position and/or number of the intermediate guide heads 430 and the position and/or number of the second support structures 400*b* are not limited thereto.

In an embodiment, the support bar 410 may be segmented into a plurality of support bars. For example, the support bar 410 may include a first support bar 410*a*, a second support bar 410*b*, and a third support bar 410*c*. The first support bar 410*a*, the second support bar 410*b*, and the third support bar 410*c* may have the same longitudinal direction (e.g., the Y direction). A first middle guide head 430*a* may be disposed between the first support bar 410*a* and the second support bar 410*b* and a second middle guide head 430*b* may be disposed between the second support bar 410*b* and the third support bar 410*c*. However, this is an example, and the number of support bars 410 and the number of middle guide heads 430 are not limited thereto.

In an embodiment, respective ends of the first support bar 410*a*, the second support bar 410*b*, and the third support bar 410*c* may be formed substantially the same as the end of the support bar 410 described with reference to FIG. 4B. For example, each of the first support bar 410*a*, the second support bar 410*b*, and the third support bar 410*c* may include a bar portion (e.g., the bar portion 411 of FIG. 4B), a connecting part (e.g., the connecting part 412 of FIG. 4B), and a recessed groove (e.g., the recessed groove 413 of FIG. 4B).

In an embodiment, the intermediate guide head 430 may slide along the intermediate guide rail 323. The intermediate guide head 430 may include an intermediate guide portion 431, a first extension 432*a*, a second extension 432*b*, a first protrusion 433*a*, a second protrusion 433*b*, a pair of first side walls 434*a*, and a pair of second side walls 434*b*.

In an embodiment, the intermediate guide portion 431 may slide along the intermediate guide rail 323. The intermediate guide portion 431 may include an intermediate head body 4311, a first guide body 4312, a second guide body 4313, a third guide body 4314, and a fourth guide body 4315. The intermediate head body 4311 may be a portion substantially disposed on the central portion of the intermediate guide head 430. The first guide body 4312 and the second guide body 4313 may be spaced apart from each other and may extend from one side portion (e.g., a portion in the +Y direction) of the intermediate head body 4311. For example, the second guide body 4313 may be disposed to be relatively spaced apart in the rear direction (e.g., the −Z direction) compared to the first guide body 4312. For example, as shown in FIG. 4J, the front surface (e.g., the surface in the +Z direction) of the first guide body 4312 may be formed as substantially the same surface as the front surface (e.g., the surface in the +Z direction) of the intermediate head body 4311. The third guide body 4314 and the fourth guide body 4315 may be spaced apart from each other and may extend from the other side portion (e.g., a portion in the −Y direction) of the intermediate head body 4311. For example, the fourth guide body 4315 may be disposed to be relatively spaced apart in the rear direction (e.g., the −Z direction) compared to the third guide body 4314. For example, as shown in FIG. 4J, the front surface (e.g., the surface in the +Z direction) of the third guide body 4314 may be formed as substantially the same surface as the front surface (e.g., the surface in the +Z direction) of the intermediate head body 4311.

In an embodiment, a first intermediate guide rail 323*a* may be disposed between the first guide body 4312 and the second guide body 4313 and a second intermediate guide rail 323*b* may be disposed between the third guide body 4314 and the fourth guide body 4315. The first intermediate guide rail 323*a* and the second intermediate guide rail 323*b* may be connected to a second housing (e.g., the second housing 320 of FIG. 3A) and may slide together with the second housing 320 relative to a first housing (e.g., the first housing 310 of FIG. 3A). For example, the first intermediate guide rail 323*a* and the second intermediate guide rail 323*b* may be formed on the display module support member 322. Each of the first intermediate guide rail 323*a* and the second intermediate guide rail 323*b* may include a shape substantially corresponding to a guide rail (e.g., the guide rail 321 of FIG. 3E). For example, the first intermediate guide rail 323*a* and the second intermediate guide rail 323*b* may each include a shape corresponding to a first straight rail (e.g., the first straight rail 3211 of FIG. 3E), a curved rail (e.g., the curved rail 3212 of FIG. 3E), and a second straight rail (e.g., the second straight rail 3213 of FIG. 3E).

In an embodiment, the first extension 432*a* may extend from an end (e.g., an end in the +Y direction) of the intermediate guide portion 431. For example, the first extension 432*a* may extend from an end (e.g., a portion in the +Y direction) of the first guide body 4312. For example, the first extension 432*a* may have a height that is substantially the same as the Z-direction height of the first guide body 4312.

In an embodiment, the second extension 432*b* may extend from the other end (e.g., the end in the −Y direction) of the intermediate guide portion 431. For example, the second extension 432*b* may extend from an end (e.g., the portion in the −Y direction) of the third guide body 4314. For example, the second extension 432*b* may have a height that is substantially the same as the Z-direction height of the third guide body 4314.

In an embodiment, the first protrusion 433*a* may protrude from the rear surface (e.g., the surface in the −Z direction) of the first extension 432*a*. For example, the first protrusion 433*a* may be formed in a perpendicular direction (e.g., the X direction) to the longitudinal direction (e.g., the Y direction) of the support bar 410. The first protrusion 433*a* may be inserted into a first recessed groove 413*a* formed in the first support bar 410*a*. However, this is an example, and the first protrusion 433*a* may be formed as the protrusions 423-1 and 423-2 respectively shown in FIGS. 4F and 4G. In addition, as shown in FIG. 4N, a recessed groove (e.g., the recessed groove 426 of FIG. 4N) may be formed in the first extension 432*a* and a protrusion (e.g., the protrusion 414 of FIG. 4N) may be formed in a first connecting part 412*a*.

In an embodiment, the second protrusion 433*b* may protrude from the rear surface (e.g., the surface in the −Z direction) of the second extension 432*b*. For example, the second protrusion 433*b* may be formed in a perpendicular direction (e.g., the X direction) to the longitudinal direction (e.g., the Y direction) of the support bar 410. The second protrusion 433*b* may be inserted into a second recessed groove 413*b* formed in the second support bar 410*b*. However, this is an example, and the second protrusion 433*b* may be formed as the protrusions 423-1 and 423-2 respectively shown in FIGS. 4F and 4G. In addition, as shown in FIG. 4N, a recessed groove (e.g., the recessed groove 426 of FIG. 4N) may be formed in the second extension 432*b* and a protrusion (e.g., the protrusion 414 of FIG. 4N) may be formed in a second connecting part 412*b*.

In an embodiment, the pair of first side walls 434*a* may extend in the rear direction (e.g., the −Z direction) from both side ends (e.g., an end in the +X direction and an end in the −X direction) of the width direction (e.g., the X direction) of the first extension 432*a*. As the pair of first side walls 434*a* is formed on both ends (e.g., the end in the +X direction and the end in the −X direction) of the first extension 432*a*, a first seating space 435*a* on which the first connecting part 412*a* is seated may be formed. The first seating space 435*a* may be formed as a shape substantially corresponding to the first connecting part 412*a*. While the first connecting part 412*a* is seated on the first seating space 435*a*, the pair of first side walls 434*a* may support a side surface in the width direction (e.g., a surface in the +x direction and a surface in the −X direction) of the first connecting part 412*a*.

In an embodiment, the pair of second side walls 434*b* may extend in the rear direction (e.g., the −Z direction) from both ends (e.g., the end in the +X direction and the end in the −X direction) in the width direction (e.g., the X direction) of the second extension 432*b*. As the pair of second side walls 434*b* is formed on both ends (e.g., the end in the +X direction and the end in the −X direction) of the second extension 432*b*, a second seating space 435*b* on which the second connecting part 412*b* is seated may be formed. The second seating space 435*b* may be formed as a shape substantially corresponding to the second connecting part 412*b*. While the second connecting part 412*b* is seated on the second seating space 435*b*, the pair of second side walls 434*b* may support a side surface in the width direction (e.g., a surface in the +X direction and a surface in the −X direction) of the second connecting part 412*b*.

In an embodiment, the first connecting part 412*a* of the first support bar 410*a* may be seated on the first extension 432*a*. For example, the first connecting part 412*a* may be seated on the first extension 432*a* such that the front surface (e.g., the surface in the +Z direction) of the first connecting part 412*a* is in contact with the rear surface (e.g., the surface in the −Z direction) of the first extension 432*a*. The second connecting part 412*b* of the second support bar 410*b* may be seated on the second extension 432*b*. For example, the second connecting part 412*b* may be seated on the second extension 432*b* such that the front surface (e.g., the surface in the +Z direction) of the second connecting part 412*b* is in contact with the rear surface (e.g., the surface in the −Z direction) of the second extension 432*b*. According to the structure described above, at least one of the intermediate guide head 430, the first support bar 410*a*, and the second support bar 410*b* is attached to the support plate 332, at least a portion of the first extension 432*a* may be positioned between the first connecting part 412*a* and the support plate 332, and at least a portion of the second extension 432*b* may be positioned between the second connecting part 412*b* and the support plate 332. The connection structure of the intermediate guide head 430 to the support bar 410 may be substantially the same as the connection structure of the guide head 420 to the support bar 410 described with reference to FIGS. 3A to 4D.

Accordingly, an effect caused by the connection between the guide head 420 and the support bar 410 described with reference to FIGS. 3A to 4D may be the same as the connection between the intermediate guide head 430 and the support bar 410. For example, a separate welding process may not be required to connect the intermediate guide head 430 to the support bar 410 and the coupling stability between the intermediate guide head 430 and the support bar 410 may be improved.

In addition, the guide head 420 of the second support structure 400*b* may be substantially the same as a guide head (e.g., the guide head 420 of FIG. 4C) of the first support structure (e.g., the first support structure 400*a* of FIG. 4O). Therefore, a detailed description of the guide head 420 of the second support structure 400*b* is omitted.

FIG. 4L is a perspective view of an end of a support bar according to an embodiment. FIG. 4M is a perspective view of a guide head according to an embodiment. FIG. 4N is a cross-sectional view of a guide head and a support bar attached to a support plate according to an embodiment. FIG. 4O is a perspective view of a support bar and a guide head according to an embodiment.

Referring to FIGS. 4L to 40, a support bar 410' in an embodiment may include the bar portion 411, the connecting part 412, the protrusion 414, and a flange portion 415. In embodiments of FIGS. 4L to 40, the bar portion 411 and the connecting part 412 may be substantially the same as the bar portion 411 and the connecting part 412 described with reference to FIGS. 4A to 4D, the description thereof is omitted.

In an embodiment, the protrusion 414 may protrude from the front surface (e.g., the surface in the +Z direction) of the connecting part 412. For example, the protrusion 414 may be formed in a perpendicular direction (e.g., the X direction) to the longitudinal direction (e.g., the y direction) of the support bar 410'. The protrusion 414 may be inserted into a recessed groove 426 formed in the guide head 420'. However, this is an example, and the protrusion 414 may be formed as the protrusions 423-1 and 423-2 respectively shown in FIGS. 4F and 4G.

In an embodiment, the flange portion 415 may extend to be stepped from both sides (e.g., the side in the +X direction and the side in the −X direction) in the width direction of the connecting part 412. Based on a view of the support bar 410' in the width direction (e.g., the X direction), the flange portion 415 may be formed in the rear direction (e.g., the −Z direction) of the connecting part 412. For example, the Z-direction height of the flange portion 415 may be less than the Z-direction height of the connecting part 412. For example, as shown in FIG. 4L, the rear surface (e.g., the surface in the −Z direction) of the flange portion 415 may be formed as a surface that is substantially the same as the rear surface (e.g., the surface in the −Z direction) of the connecting part 412 and the bar portion 411. While the guide head 420' is connected to the support bar 410', the flange portion 415 may cover the pair of side walls 424 of the guide head 420'.

Still referring to FIGS. 4L to 40, the guide head 420' in an embodiment (see e.g., FIG. 4M) may include the guide portion 421, the extension 422, the pair of side walls 424, the recessed groove 426, and an undercut groove 427. In the embodiments of FIGS. 4L to 40, the guide portion 421 and the extension 422 may be substantially the same as the guide portion 421 and the extension 422 described with reference to FIGS. 4A to 4D, the description thereof is omitted.

In an embodiment, the recessed groove 426 may be recessed from the rear surface (e.g., the surface in the Z direction) of the extension 422. The protrusion 414 formed in the support bar 410' may be inserted into the recessed groove 426. The recessed groove 426 may be formed as the shape and/or size corresponding to the protrusion 414 of the support bar 410'. For example, the recessed groove 426 may be formed in a direction (e.g., the X direction) that is perpendicular to the longitudinal direction (e.g., the Y direction) of the support bar 410'.

In an embodiment, the first guide body 4212 and the second guide body 4213 may be spaced apart from each other and may extend from one side (e.g., the side in the +Y direction) of the head body 4211. The undercut groove 427 may be formed on the other side (e.g., the side in the −Y direction) of the head body 4211. For example, the undercut groove 427 may be recessed from the other side surface (e.g., the surface in the −Y direction) of the head body 4211. When the support bar 410' and the guide head 420' are connected to each other, the end of the connecting part 412 may be inserted into the undercut groove 427 in the longitudinal direction (e.g., the Y direction). As the end of the connecting part 412 is inserted into the undercut groove 427, the coupling stability between the support bar 410' and the guide head 420' may be improved.

In an embodiment, when the support bar 410' and the guide head 420' are connected to each other, a pair of side walls 424' may be covered by the flange portion 415 of the support bar 410'. For example, the front surface (e.g., the surface in the +Z direction) of the flange portion 415 may be in contact with the rear surface (e.g., the surface in the −Z direction) of the pair of side walls 424'. For this, in the embodiments of FIGS. 4L to 4O, the pair of side walls 424' may be formed to have a lower height (e.g., the Z-direction height) than the pair of side walls 424 in the embodiments of FIGS. 4A to 4D.

In an embodiment, an uneven portion may be formed on a front surface 4101' (e.g., the surface in the +Z direction) of the support bar 410'. The front surface 4101' of the support bar 410' may be a surface to which the support plate 332 is attached. As the uneven portion is formed on the front surface 4101' of the support bar 410', a contact area between the adhesive member 333 and the front surface 4101' of the support bar 410' may increase. Accordingly, the adhesion between the support bar 410' and the support plate 332 may increase. However, the uneven shape shown in FIG. 4O is an example, and the uneven shape is not limited thereto.

In an embodiment, an uneven portion may be formed on a front surface 4201' (e.g., the surface in the +Z direction) of the guide head 420'. The front surface 4201' of the guide head 420' may be a surface to which the support plate 332 is attached. As the uneven portion is formed on the front surface 4201' of the guide head 420', a contact area between the adhesive member 333 and the front surface 4201' of the guide head 420' may increase. Accordingly, the adhesion between the guide head 420' and the support plate 332 may increase. However, the uneven shape shown in FIG. 4O is an example, and the uneven shape is not limited thereto.

In addition, the connection structure between the guide head 420' and the support bar 410' according to FIGS. 4L to 4O may apply to an intermediate guide head (e.g., the intermediate guide head 430 of FIG. 4I) and a support bar (e.g., the support bar 410*a* and/or the second support bar 410*b* of FIG. 4I). For example, the intermediate guide head 430 in an embodiment may include an undercut groove (e.g., the undercut groove 427 of FIG. 4N). In an embodiment, the support bar 410*a* or 410*b* may include a flange portion (e.g., the flange portion 415 of FIG. 4I). An uneven portion may be formed on front surfaces (e.g., the surface in the +Z direction) of the support bars 410*a* and 410*b* and the intermediate guide head 430.

In an embodiment, the electronic device 300 may include the first housing 310, the second housing 320 connected to the first housing to enable insertion or withdrawal of the second housing 320 into or from the first housing 310, the guide rail 321 connected to the second housing 320, the display module 330 which is supported by at least one of the first housing 310 and the second housing 320 and of which a display area changes depending on a movement of the second housing 320 relative to the first housing 310, wherein the display module may include the display panel 331, the support plate 332 disposed on the rear surface of the display panel 331, and the plurality of support structures 400 spaced apart from each other and disposed on the rear surface of the support plate 332, wherein the support structure 400 may include the support bar 410 formed in the longitudinal direction and the guide head 420 disposed on the end of the support bar 410, wherein the guide head 420 may include the guide portion 421 that is slidable along the guide rail 321, and the extension 422 extending from the end of the guide portion 421, wherein at least a portion of the extension 422 is disposed between the end of the support bar 410 and the support plate 332.

In an embodiment, the support bar 410 may include the bar portion 411 having a longitudinal direction and the connecting part 412 extending from an end of the bar portion 411 and seated on the rear surface of the extension 422.

In an embodiment, the guide head 420 may further include the protrusion 423 protruding from the rear surface of the extension 422, and the support bar 410 may further include the recessed groove 413 recessed from the front surface of the connecting part 412 to insert the protrusion 423 therein.

In an embodiment, the protrusion 423 and the recessed groove 413 may have a width direction that is perpendicular to the longitudinal direction of the support bar 410.

In an embodiment, the support bar 410 may further include the protrusion 414 protruding from the front surface of the connecting part 412, and the guide head 420 may further include the recessed groove 426 recessed from the rear surface of the extension 422 to insert the protrusion 414 therein.

In an embodiment, the guide portion 421 may include the head body 4211, the first guide body 4212 and the second guide body 4213 spaced apart from each other and extending from one side of the head body 4211.

In an embodiment, the guide portion 421 may further include the undercut groove 427 recessed from the other side of the head body 4211 to insert an end of the connecting part 412 in a longitudinal direction.

In an embodiment, the guide head 420 may further include the pair of side walls 424 extending in the rear direction from both side ends of the extension 422 to form the seating space 425 on which the connecting part 412 is seated.

In an embodiment, the support bar 410 may further include the flange portion 415 protruding to be stepped from both sides of the connecting part 412 to cover the pair of side walls 424.

In an embodiment, the support bar 410 and the guide head 420 may be attached to the support plate 332 by the adhesive member 333.

In an embodiment, an uneven portion may be formed on the surface 4101 or 4201 in which the support bar 410 or the guide head 420 is attached to the support plate.

In an embodiment, the longitudinal direction of the support bar 410 may be perpendicular to a direction in which the second housing 320 is inserted into and withdrawn from the first housing 310.

In an embodiment, the support plate 332 may include the plurality of grating structures 3321 of which at least a portion is bendable.

In an embodiment, each of the plurality of support structures 400 may be between the plurality of grating structures 3321.

In an embodiment, the pair of guide rails 321 may be provided and disposed on both sides of the second housing 320, and the pair of guide heads 420 may be provided and disposed on both ends of the support bar 410.

In an embodiment, the electronic device 300 may include the first housing 310, the second housing 320 connected to the first housing to enable insertion or withdrawal of the second housing 320 into or from the first housing 310, the intermediate guide rail 323 connected to the second housing 320, and the display module 330 which is supported by at least one of the first housing 310 and the second housing 320 and of which a display area changes depending on a movement of the second housing 320 relative to the first housing 310, wherein the display module 330 may include the display panel 331, the support plate 332 disposed on the rear surface of the display panel 331, and the plurality of support structures 400 spaced part from each other and disposed on the rear surface of the support plate 332, wherein the support structure 400 may include the first support bar **410*a* formed in a longitudinal direction, the second support bar 410*b* formed in the same longitudinal direction as the first support bar 410*a*, and the intermediate guide head 430 disposed between the first support bar 410*a* and the second support bar 410*b*, wherein the intermediate guide head 430 may include the intermediate guide portion 431 that is slidable along the intermediate guide rail 323, the first extension 432*a* which extends from an end of the intermediate guide portion 431 and of which at least a portion is disposed between an end of the first support bar 410*a* and the support plate 332, and the second extension 432*b* which extends from the other end of the intermediate guide portion 431 and of which at least a portion is disposed between an end of the second support bar 410*b* and the support plate 332**.

In I an embodiment, the intermediate guide portion 431 may include the intermediate head body 4311, the first guide body 4312 and the second guide body 4313 spaced apart from each other and extending from one side of the head body 4311, and the third guide body 4314 and the fourth guide body 4315 spaced apart from each other and extending from the other side of the head body 4311.

In an embodiment, the first extension **432*a* may extend from an end of the first guide body 4312 and the second extension 432*b* may extend from an end of the third guide body 4314**.

In an embodiment, the intermediate guide portion 431 may include the first protrusion **433*a* protruding from the rear surface of the first extension 432*a* and the second protrusion 433*b* protruding from the rear surface of the second extension 432*b***.

In an embodiment, the electronic device 300 may include the first housing 310, the second housing 320 connected to the first housing to enable insertion or withdrawal of the second housing 320 into or from the first housing 310, the guide rail 321 connected to the second housing 320, and the display module 330 which is supported by at least one of the first housing 310 and the second housing 320 and of which a display area changes depending on a movement of the second housing 320 relative to the first housing 310, wherein the display module 330 may include the display panel 331, the support plate 332 disposed on the rear surface of the display panel 331, the plurality of support structures 400 spaced apart from each other and disposed on the rear surface of the support plate 332, and the support structure 400 may include the support bar 410 formed in the longitudinal direction and the guide head 420 disposed on an end of the support bar 410, wherein the guide head 420 may include the guide portion 421 that is slidable along the guide rail 321, the extension 422 which extends from an end of the guide portion 421 and of which at least a portion is disposed between the end of the support bar 410 and the support plate 332, the protrusion 423 protruding from the rear surface of the extension 422, and the pair of side walls 424 extending from both side ends of the extension 422 in the rear direction to form the seating space 425, wherein the support bar 410 may include the bar portion 411 having a longitudinal direction, the connecting part 412 extending from an end of the bar portion 411 and seated on the seating space 425, and the recessed groove 413 from a front surface of the connecting part 412 to insert the protrusion 423 therein.

The invention claimed is:

1. An electronic device comprising:

a first housing;

a second housing connected to the first housing to enable insertion or withdrawal of the second housing into or from the first housing;

at least one guide rail connected to the second housing; and a display module which is supported by at least one of the first housing and the second housing and of which a display area changes depending on a movement of the second housing relative to the first housing, wherein the display module comprises:

a display panel;

a support plate disposed on a rear surface of the display panel; and a plurality of support structures spaced apart from each other and disposed on a rear surface of the support plate, wherein each of the support structures comprises:

a support bar formed in a longitudinal direction; and at least one guide head disposed on an end of the support bar, wherein the at least one guide head comprises:

a guide portion that is slidable along the at least one guide rail; and an extension extending from an end of the guide portion, wherein at least a portion of the extension is disposed between the end of the support bar and the support plate.

2. The electronic device of claim 1, wherein the support bar comprises:

a bar portion having a longitudinal direction; and a connecting part extending from an end of the bar portion and seated on a rear surface of the extension.

3. The electronic device of claim 2, wherein the at least one guide head further comprises a protrusion protruding from the rear surface of the extension, and the support bar further comprises a recessed groove recessed from a front surface of the connecting part to insert the protrusion therein.

4. The electronic device of claim 3, wherein the protrusion and the recessed groove have a width direction that is perpendicular to the longitudinal direction of the support bar.

5. The electronic device of claim 2, wherein the support bar further comprises a protrusion protruding from a front surface of the connecting part, and the at least one guide head further comprises a recessed groove recessed from the rear surface of the extension to insert the protrusion therein.

6. The electronic device of claim 2, wherein the guide portion comprises:

a head body; and a first guide body and a second guide body spaced apart from each other and extending from one side of the head body.

7. The electronic device of claim 6, wherein the guide portion further comprises an undercut groove recessed from the other side of the head body to insert an end of the connecting part in the longitudinal direction.

8. The electronic device of claim 2, wherein the at least one guide head further comprises a pair of side walls extending in a rear direction from both side ends of the extension to form a seating space on which the connecting part is seated.

9. The electronic device of claim 8, wherein the support bar further comprises a flange portion protruding to be stepped from both sides of the connecting part to cover the pair of side walls.

10. The electronic device of claim 1, wherein the support bar and the at least one guide head are attached to the support plate by an adhesive member.

11. The electronic device of claim 10, wherein an uneven portion is formed on a surface in which the support bar or the at least one guide head is attached to the support plate.

12. The electronic device of claim 1, wherein the longitudinal direction of the support bar is perpendicular to a direction in which the second housing is inserted into and withdrawn from the first housing.

13. The electronic device of claim 1, wherein the support plate comprises a plurality of grating structures of which at least a portion is bendable.

14. The electronic device of claim 13, wherein each of the plurality of support structures is disposed between the plurality of grating structures.

15. The electronic device of claim 1, wherein at least one guide rail includes a pair of guide rails disposed on both sides of the second housing, and wherein the at least one guide head includes a pair of guide heads disposed on both ends of the support bar.

16. An electronic device comprising:
a first housing;
a second housing connected to the first housing to enable insertion or withdrawal of the second housing into or from the first housing;
an intermediate guide rail connected to the second housing;
a display module supported by at least one of the first housing and the second housing and of which a display area changes depending on a movement of the second housing relative to the first housing,
wherein the display module includes:
a display panel;
a support plate disposed on a rear surface of the display panel; and
a plurality of support structures spaced part from each other and disposed on the rear surface of the support plate, each of the support structures including a first support bar extending in a longitudinal direction, a second support bar extending in the longitudinal direction, and an intermediate guide head disposed between the first support bar and the second support bar, and
wherein the intermediate guide head comprises:
an intermediate guide portion that is slidable along the intermediate guide rail; and
at least one extension extending from an end of the guide portion.

17. The electronic device of claim 16, wherein the at least one extension comprises:
a first extension which extends from an end of the intermediate guide portion and of which at least a portion is disposed between an end of the first support bar and the support plate; and
a second extension which extends from an opposing end of the intermediate guide portion and of which at least a portion is disposed between an end of the second support bar and the support plate.

18. An electronic device comprising:
a first housing;
a second housing connected to the first housing to enable insertion or withdrawal of the second housing into or from the first housing;
a guide rail connected to the second housing;
a display module which is supported by at least one of the first housing and the second housing and of which a display area changes depending on a movement of the second housing relative to the first housing,
wherein the display module comprises:
a display panel,
a support plate disposed on a rear surface of the display module,
a plurality of support structures spaced apart from each other and disposed on a rear surface of the support plate, each of the support structures comprising:
a support bar extending in a longitudinal direction; and
a guide head disposed on an end of the support bar, wherein the guide head comprises:
a guide portion that is slidable along the guide rail;
an extension which extends from an end of the guide portion and of which at least a portion is disposed between the end of the support bar and the support plate;
a protrusion protruding from a rear surface of the extension;
a pair of side walls extending from both side ends of the extension in a rear direction to form a seating space.

19. The electronic device of claim 18, wherein the support bar comprises:
a bar portion extending along the longitudinal direction;
a connecting part extending from an end of the bar portion and seated on the seating space; and
a recessed groove formed in a front surface of the connecting part.

20. The electronic device of claim 18, wherein the recessed groove is configured to insert the protrusion therein.

* * * * *